US010191805B2

(12) United States Patent
Cha et al.

(10) Patent No.: US 10,191,805 B2
(45) Date of Patent: Jan. 29, 2019

(54) SEMICONDUCTOR MEMORY DEVICES AND MEMORY SYSTEMS INCLUDING THE SAME

(71) Applicant: Samsung Electronics Co., Ltd., Suwon-si, Gyeonggi-do (KR)

(72) Inventors: Sang-Uhn Cha, Yongin-si (KR); Hoi-Ju Chung, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 105 days.

(21) Appl. No.: 15/204,536

(22) Filed: Jul. 7, 2016

(65) Prior Publication Data

US 2017/0109231 A1    Apr. 20, 2017

(30) Foreign Application Priority Data

Oct. 20, 2015  (KR) .................. 10-2015-0145727

(51) Int. Cl.
    *G06F 11/10*    (2006.01)
    *G11C 29/52*   (2006.01)
    *G11C 29/04*   (2006.01)

(52) U.S. Cl.
    CPC ...... *G06F 11/1068* (2013.01); *G06F 11/1048* (2013.01); *G11C 29/52* (2013.01); *G11C 2029/0411* (2013.01)

(58) Field of Classification Search
    CPC ................................................. G06F 11/1068
    See application file for complete search history.

(56) References Cited

U.S. PATENT DOCUMENTS

| | | | |
|---|---|---|---|
| 4,358,848 A | 11/1982 | Patel | |
| 6,070,262 A | 5/2000 | Kellogg et al. | |
| 6,279,072 B1 | 8/2001 | Williams et al. | |
| 6,725,343 B2 | 4/2004 | Barroso et al. | |
| 8,429,498 B1 | 4/2013 | Anholt et al. | |
| 8,930,779 B2 | 1/2015 | Ware et al. | |
| 9,600,410 B1* | 3/2017 | Nazarian | G11C 7/106 |
| 9,768,807 B2* | 9/2017 | Zhang | H03M 13/1575 |
| 2003/0037299 A1* | 2/2003 | Smith | G06F 11/1012 |
| | | | 714/763 |
| 2004/0163027 A1 | 8/2004 | MacLaren et al. | |
| 2009/0113272 A1* | 4/2009 | Tan | G06F 11/1052 |
| | | | 714/765 |
| 2010/0281341 A1* | 11/2010 | Wu | G06F 11/1068 |
| | | | 714/763 |
| 2011/0231735 A1* | 9/2011 | Park | G06F 11/1044 |
| | | | 714/767 |
| 2012/0317463 A1* | 12/2012 | Sugahara | G06F 11/1048 |
| | | | 714/785 |
| 2016/0062830 A1 | 3/2016 | Cha et al. | |

* cited by examiner

*Primary Examiner* — Steve N Nguyen
(74) *Attorney, Agent, or Firm* — Muir Patent Law, PLLC

(57) ABSTRACT

A semiconductor memory device includes a memory cell array, an error correction circuit and a control logic circuit. The error correction circuit performs an error correction code (ECC) encoding on write data to be stored in the memory cell array, and performs an ECC decoding on read data from the memory cell array. The control logic circuit controls access to the memory cell array and generates an engine configuration selection signal based on a command. The error correction circuit reconfigures a number of units for which ECC including the ECC encoding and the ECC decoding is performed, in response to the engine configuration selection signal.

14 Claims, 24 Drawing Sheets

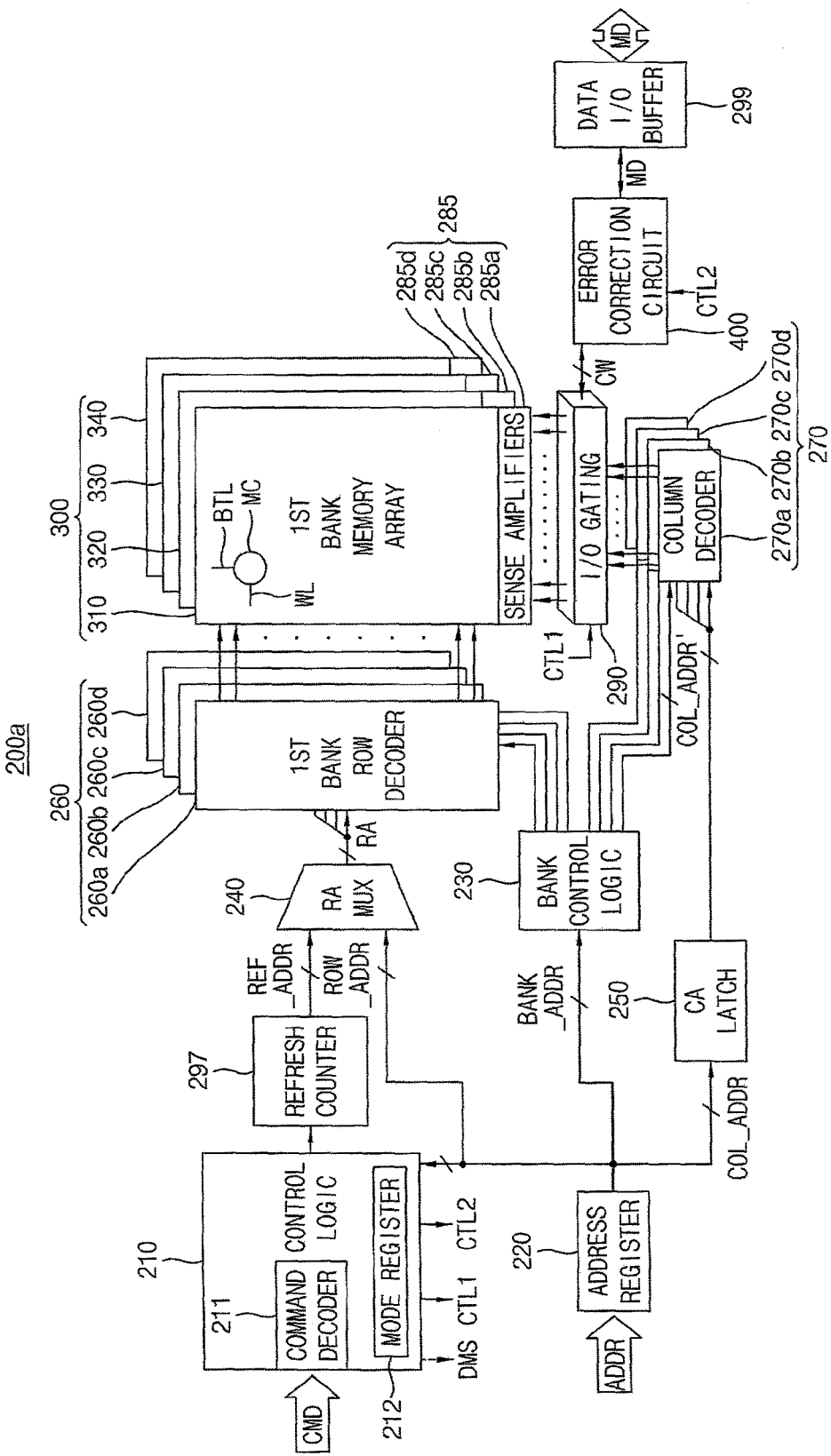

SEMICONDUCTOR MEMORY DEVICES AND MEMORY SYSTEMS INCLUDING THE SAME

CROSS-REFERENCE TO RELATED APPLICATIONS

This US application claims the benefit of priority under 35 USC § 119 to Korean Patent Application No. 10-2015-0145727, filed on Oct. 20, 2015, in the Korean Intellectual Property Office, the contents of which are incorporated herein in their entirety by reference.

BACKGROUND

The present disclosure relates to memories, and more particularly to semiconductor memory devices and memory systems including the same.

Semiconductor memory devices may be classified into non-volatile memory devices such as flash memory devices and volatile memory devices such as DRAMs. High speed operation and cost efficiency of DRAMs make it possible for DRAMs to be used for system memories. However, due to the continuing shrink in fabrication design rule of DRAMs, bit errors of memory cells in the DRAMs may rapidly increase and yield of the DRAMs may decrease.

SUMMARY

Some example embodiments may provide a semiconductor memory device, capable of enhancing performance.

Some example embodiments may provide a memory system including the semiconductor memory device.

According to example embodiments, a semiconductor memory device includes a memory cell array, an error correction circuit and a control logic circuit. The error correction circuit performs an error correction code (ECC) encoding on write data to be stored in the memory cell array, and performs an ECC decoding on read data from the memory cell array. The control logic circuit controls access to the memory cell array and generates an engine configuration selection signal based on a command. The error correction circuit reconfigures a number of units of ECC performing that includes the ECC encoding and the ECC decoding, in response to the engine configuration selection signal. Each unit of the ECC performing corresponds to correcting an error bit among the read data having n bits, wherein n is a natural number greater than 2 and is variable in response to the engine configuration selection signal.

In example embodiments, when the error correction circuit operates in a first engine configuration mode in response to the engine configuration selection signal, the error correction circuit may operate as one ECC engine that performs an ECC encoding on $2^h$-bit write data to generate (h+1)-bit parity data, and performs an ECC decoding on $2^h$-bit read data and (h+1)-bit read parity data. Further, h may be a natural number equal to or greater than two.

In example embodiments, h may be seven.

In example embodiments, when the error correction circuit operates in a second engine configuration mode in response to the engine configuration selection signal, the error correction circuit may operate as a plurality of ECC engines. Each of the ECC engines may perform an ECC encoding on $2^f$-bit write data of $2^h$-bit write data to generate (f+1)-bit parity data, and may perform an ECC decoding on $2^f$-bit read data and (f+1)-bit read parity data. The h may be a natural number equal to or greater than two, and f may be a natural number smaller than h.

In example embodiments, h may be seven, f may be three and a number of the plurality of ECC engines may be sixteen.

In example embodiments, the error correction circuit may include an ECC engine and a data corrector. The ECC engine may perform the ECC encoding on the write data to generate a parity data, and may perform the ECC decoding on the read data and a read parity data from the memory cell array to generate a syndrome data. The data corrector may correct an error bit among the read data based on the syndrome data.

The ECC engine may include a check bit generator and a syndrome generator. The check bit generator may generate check bits based on the read data. The syndrome generator may generate the syndrome data based on the check bits and the read parity data. The check bit generator may include a plurality of check bit sub generators. The plurality of check bit sub generators may be connected to each other and may operate in a first engine configuration mode or may be separated from each other and may operate in a second engine configuration mode, in response to the engine configuration selection signal.

Each of the plurality of check bit sub generators may include a first XOR module, a second XOR module a switch and a demultiplexer. The first XOR module may perform an XOR operation on $2^f$-bit read data of $2^h$-bit read data to generate first (f+1)-bit partial check bits. The second XOR module may perform an XOR operation on the $2^f$-bit read data to generate second (f+1)-bit partial check bits. The switch may be coupled between the first XOR module and the second XOR module. The switch may selectively provide the $2^f$-bit read data to the second XOR module in response to the engine configuration selection signal. The demultiplexer may provide the first (f+1)-bit partial check bits to one of a first path and a second path in response to the engine configuration selection signal. The h is a natural number equal to or greater than 2, and f is a natural number smaller than h.

The switch may be closed when the engine configuration selection signal has a first logic level, each of the demultiplexers may provide the first partial check bits to the first path and the plurality of check bit sub generators may be connected to each other to generate (h+1)-bit check bits based on the $2^h$-bit read data.

The switch may be opened when the engine configuration selection signal has a second logic level opposite to the first logic level, each of the demultiplexers may provide the first partial check bits to the second path and each of the check bit sub generators may generate (f+1)-bit check bits based on the $2^f$-bit read data.

In example embodiments, the memory cell array may include a plurality of bank arrays. The control logic circuit may further generate a density mode signal based on the command. When the density mode signal indicates a first density mode and the engine configuration selection signal indicates a first engine configuration mode, the error correction circuit may perform an ECC encoding on $2^h$-bit write data to generate (h+1)-bit parity data and may store the $2^h$-bit write data and the (h+1)-bit parity data in a first bank array of the plurality of bank arrays, and h may be a natural number equal to or greater than two.

In example embodiments, each bank array of the plurality of bank arrays may include a first sub array and a second sub array. When the density mode signal indicates a second density mode and the engine configuration selection signal indicates a second engine configuration mode, the error correction circuit may operate as a plurality of ECC engines, and each of the ECC engines may perform an ECC encoding on $2^f$-bit write data of $2^h$-bit write data to generate (f+1)-bit parity data, and may perform an ECC decoding on $2^f$-bit read data and (f+1)-bit read parity data. The ECC engines may store a group of the $2^f$-bit write data in a first sub array in a first bank array of the plurality of bank arrays and may store a group of the (f+1)-bit parity data in a first sub array of a second bank array different from the first bank array of the plurality of bank arrays. The h may be a natural number equal to or greater than two, and f may be a natural number smaller than h.

A second sub array of the second bank array may include at least one defective memory cell.

In example embodiments, the memory cell array may include a three-dimensional memory cell array and the memory cell array may include a plurality of dynamic memory cells or a plurality of resistive type memory cells.

According to example embodiments, a memory system includes at least one semiconductor memory device and a memory controller. The memory controller controls the at least one semiconductor memory device. The at least one semiconductor memory device includes a memory cell array, an error correction circuit and a control logic circuit. The error correction circuit performs an error correction code (ECC) encoding on write data to be stored in the memory cell array, and performs an ECC decoding on read data from the memory cell array. The control logic circuit controls access to the memory cell array and generates an engine configuration selection signal based on a command from the memory controller. The error correction circuit reconfigures a number of units of ECC performing that includes the ECC encoding and the ECC decoding, in response to the engine configuration selection signal. Each unit of the ECC performing corresponds to correcting an error bit among the read data having n bits, wherein n is a natural number greater than 2 and is variable in response to the engine configuration selection signal.

According to example embodiments, a semiconductor memory device includes a memory cell array, a control circuit configured to generate a control signal based on a command, and an error correction circuit configured to correct an error bit among m-bit read data from the memory cell array using an error correction code (ECC), wherein m is a natural number equal to or greater than 2 and is variable in response to the control signal. The error correction circuit includes a parity generator configured to generate p-bit parity data using write data in response to the control signal, wherein the write data and the p-bit parity data are to be stored in the memory cell array, p being a natural number equal to or greater than 2, and a data corrector configured to generate corrected data using the m-bit read data and the p-bit parity data from the memory cell array in response to the control signal.

Accordingly, a semiconductor memory device according to example embodiments includes an error correction circuit and a memory cell array. The error correction circuit may operate as one ECC engine or a plurality of ECC engines in response to an engine configuration selection signal and may implement one or more ECC algorithms. Therefore, performance of the error correction circuit may be enhanced.

BRIEF DESCRIPTION OF THE DRAWINGS

Example embodiments will be described below in more detail with reference to the accompanying drawings.

FIG. 3 is a block diagram illustrating a semiconductor memory device shown in FIG. 2, according to example embodiments.

DETAILED DESCRIPTION

Figure 1:
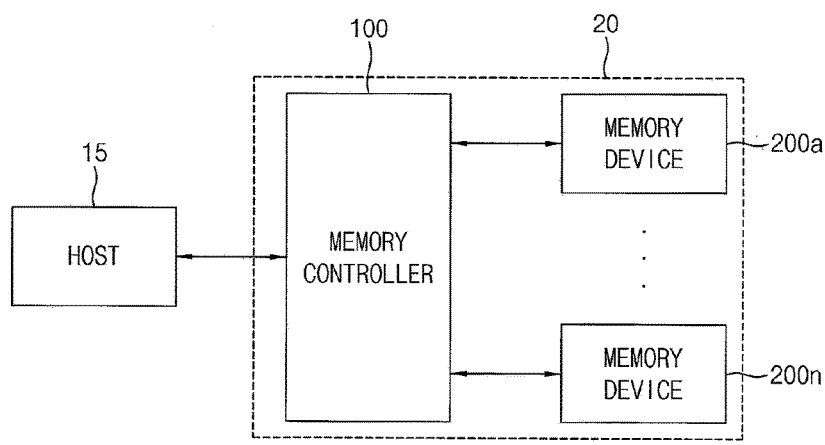
FIG. 1 is a block diagram illustrating an electronic system according to example embodiments.

Various example embodiments will be described more fully hereinafter with reference to the accompanying drawings, in which some example embodiments are shown. However, the present disclosure may be embodied in many different forms and should not be construed as limited to the example embodiments set forth herein. These example embodiments are just for disclosing of the disclosure and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). The term "contact," as used herein refers to direct connection (i.e., touching), unless the context indicates otherwise.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

As used herein, a semiconductor memory device may refer, for example, to a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

Referring to FIG. 1, an electronic system 10 may include a host 15 and a memory system 20. The memory system 20 may include a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a~200n. For example, the memory controller 100 may write data in the plurality of semiconductor memory devices 200a~200n or read data from the plurality of semiconductor memory devices 200a~200n in response to request from the host 15.

In addition, the memory controller 100 may issue operation commands to the plurality of semiconductor memory devices 200a~200n for controlling the plurality of semiconductor memory devices 200a~200n.

In some embodiments, each of the plurality of semiconductor memory devices 200a~200n may be a may be a memory device including resistive type memory cells such as a magnetoresistive random access memory (MRAM), a resistive random access memory (RRAM), a phase change random access memory (PRAM) and a ferroelectric random access memory (FRAM), etc. In other example embodiments, each of the plurality of semiconductor memory devices 200a~200n may be a memory device including dynamic memory cells such as a dynamic random access memory (DRAM).

An MRAM is a nonvolatile memory device based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 2:
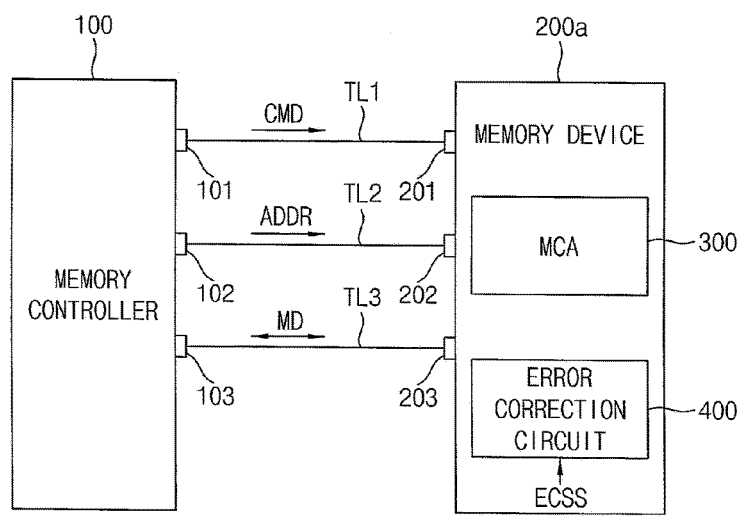
FIG. 2 is a block diagram illustrating the memory system shown in FIG. 1 according to example embodiments.

FIG. 2 is a block diagram illustrating the memory system shown in FIG. 1 according to example embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200n.

Referring to FIG. 2, the memory system 20 may include the memory controller 100 and the semiconductor memory device 200a. Each of the memory controller 100 and the semiconductor memory device 200a may be formed as a separate semiconductor chip or as a separate group of chips (e.g., the memory controller 100 and the semiconductor memory device 200a may be packaged together in stacking form of the semiconductor chips). The memory controller 100 and the semiconductor memory device 200a may be connected to each other through corresponding command pins 101 and 201, corresponding address pins 102 and 202, and corresponding data pins 103 and 203. The command pins 101 and 201 may transmit a command signal CMD through a command transmission line TL1, the address pins 102 and 202 may transmit an address signal ADDR through an address transmission line TL2, and the data pins 103 and 203 may exchange main data MD through a data transmission line TL3.

The semiconductor memory device 200a may include a memory cell array 300 and an error correction circuit 400. The error correction circuit 400 may perform an error correction code (ECC) encoding on the main data MD (e.g., write data) to generate a parity data and may store the main data MD and the parity data in the memory cell array 300. The error correction circuit 400 may perform an ECC decoding on a read data and a parity data from the memory cell array and may correct an error bit of the read data and the parity data. The error correction circuit 400 may reconfigure (e.g., adjust or change) a number of units of ECC performing that includes the ECC encoding and the ECC decoding, in response to an engine configuration selection signal ECSS. For example, the error correction circuit 400 may implement a plurality of ECC algorithms and one of the plurality of ECC algorithms may be selected to be implemented in response to the engine configuration selection signal ECSS.

FIG. 3 is a block diagram illustrating a semiconductor memory device shown in FIG. 2, according to example embodiments.

Referring to FIG. 3, the semiconductor memory device 200a may include a control logic (or control logic circuit) 210, an address register 220, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, the error correction circuit 400, and a data input/output (I/O) buffer 299.

In some embodiments, the refresh counter 297 may not be included in the semiconductor memory device 200a. For example, when the memory cell array 300 is implemented with a plurality of resistive type memory cells, the refresh counter 297 is not be included in the semiconductor memory device 200a.

The memory cell array 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~285d respectively coupled to the first through fourth bank arrays 310~340. Each of the first through fourth bank arrays 310~340 may include a plurality of memory cells MC, and each of the memory cells MC is coupled to a corresponding word line WL and a corresponding bit line BTL. The first through fourth bank arrays 310~340, the first through fourth bank row decoders 260a~260d, the first through fourth bank column decoders 270a~270d and first through fourth bank sense amplifiers 285a~285d may form first through fourth banks. Although the semiconductor memory device 200a shown in FIG. 3 illustrates four banks, the semiconductor memory device 200a may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may generate a refresh row address REF_ADDR for refreshing memory cell rows in the memory cell array 300 under control of the control logic circuit 210. The refresh counter 297 may be included when the memory cells MC are implemented with dynamic memory cells.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word line corresponding to the row address RA. For example, the activated bank row decoder may apply a word line driving voltage to the word line corresponding to the row address RA.

The column address latch 250 may receive the column address COL_ADDR from the address register 220, and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column address COL_ADDR' to the first through fourth bank column decoders 270a~270d.

The activated one of the first through fourth bank column decoders 270a~270d may decode the column address COL_ADDR' that is output from the column address latch 250, and may control the I/O gating circuit 290 in order to output data corresponding to the column address COL_ADDR'.

The I/O gating circuit 290 may include a circuitry for gating input/output data. The I/O gating circuit 290 may further include input data mask logic, read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. Main data MD to be written in one bank array of the first through fourth bank arrays 310~340 may be provided to the data I/O buffer 299 from the memory controller 100. The main data MD provided to the data I/O buffer 299 may be provided to the error correction circuit 400. The main data MD is encoded to the codeword CW in the error correction circuit 400, and the codeword CW is provided to the I/O gating circuit 290. The write driver may write the codeword CW in one bank array of the first through fourth bank arrays 310~340.

The data I/O buffer 299 may provide the main data MD from the memory controller 100 to the error correction circuit 400 in a write operation and may provide the main data MD from the error correction circuit 400 to the memory controller 100 in a read operation.

The error correction circuit 400, in a write operation, may generate parity data based on the main data MD from the data I/O buffer 299, and may provide the I/O gating circuit 290 with the codeword CW including the main data MD and the parity data. The I/O gating circuit 290 may write the codeword CW in one bank array.

In addition, the error correction circuit 400, in a read operation, may receive the codeword CW, read from one bank array, from the I/O gating circuit 290. The error correction circuit 400 may perform an ECC decoding on the main data MD based on the parity data in the codeword CW, may correct a single bit error in the main data MD and may provide corrected main data to the data I/O buffer 299. When the error correction circuit 400 performs the ECC encoding and the ECC decoding, a number of units of ECC performing may be reconfigurable (or adjustable) in response to the engine configuration selection signal ECSS included in a second control signal CTL2.

The control logic circuit 210 may control operations of the semiconductor memory device 200a. For example, the control logic circuit 210 may generate control signals for the semiconductor memory device 200a in order to perform a write operation or a read operation. The control logic circuit 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the I/O gating circuit 290 a second control signal CTL2 to control the error correction circuit 400. In addition, the control logic circuit 210 may generate a density mode signal DMS indicating a density mode of the memory cell array 300. The second control signal CTL2 may include the engine configuration selection signal ECSS.

FIGS. 4A to 4E are circuit diagrams of examples of a memory cell shown in FIG. 3, according to example embodiments.

Figure 4A:
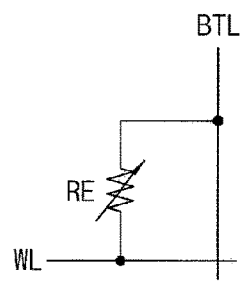
FIGS. 4A to 4E are circuit diagrams of examples of a memory cell shown in FIG. 3, according to example embodiments.
Figure 4B:
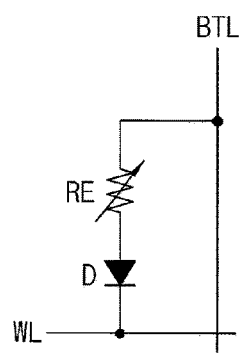
Figure 4C:
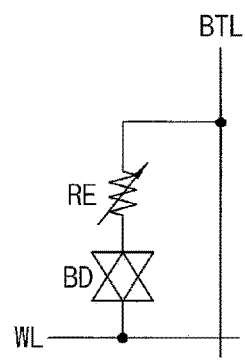
Figure 4D:
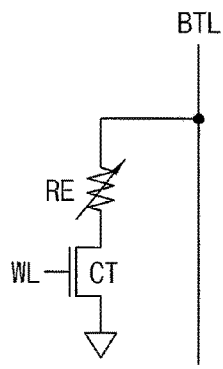
Figure 4E:
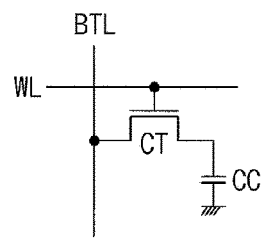

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit line BTL and a word line WL. Such a resistive memory cell having a structure without a selection element may store data by a voltage applied between bit line BL and word line WL.

Referring to FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word line WL and bit line BTL. The diode D may be coupled between the resistive element RE and word line WL, and the resistive element RE may be coupled between the bit line BTL and the diode D. Positions of the diode D and the resistive element RE may be interchangeable. The diode D may be turned on or turned off by a word line voltage. Thus, a resistive memory cell may be not driven where a voltage of a constant level or higher is supplied to an unselected word line WL.

Referring to FIG. 4C, a memory cell MC may include a resistive element RE and a bidirectional diode BD. The resistive element R may include a resistive material for data storage. The bidirectional diode BD may be coupled between the resistive element RE and a word line WL, and the resistive element RE may be coupled between a bit line BTL and bidirectional diode BD. Positions of the bidirectional diode BD and the resistive element RE may be interchangeable. The bidirectional diode BD may block leakage current flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supply to the resistive element RE according to a voltage of a word line WL. The transistor CT may be coupled between the resistive element RE and a word line WL, and the resistive element RE may be coupled between a bit line BTL and the transistor CT. Positions of the transistor CT and the resistive element RE may be interchangeable. The semiconductor memory cell may be selected or unselected depending on whether the transistor CT drive by word line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit line BTL according to a voltage of a word line WL. The transistor CT may be coupled between the cell capacitor CC, a word line WL and a bit line BTL, and the cell capacitor CC may be coupled between the transistor CT and a plate voltage (not illustrated).

Figure 5:
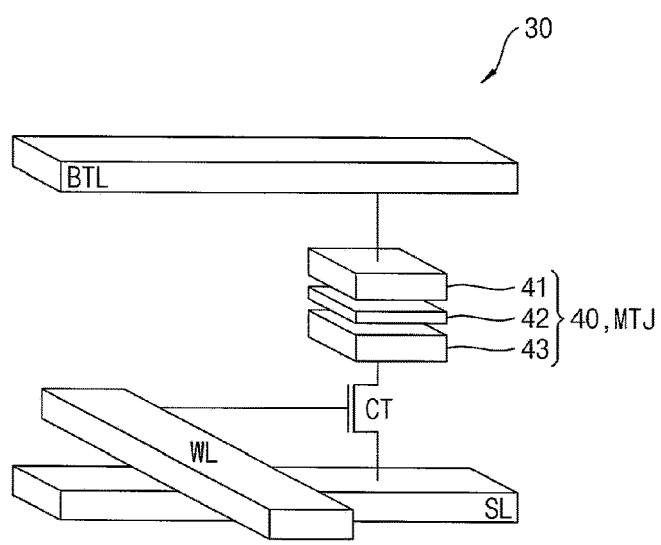
FIG. 5 illustrates an example of a memory cell (referred to as STT-MRAM cell) shown in FIG. 3, according to example embodiments.

FIG. 5 illustrates an example of a memory cell (referred to as STT-MRAM cell) shown in FIG. 3, according to example embodiments.

Referring to FIG. 5, an STT-MRAM cell 30 may include a MTJ element 40 and a cell transistor CT. A gate of the cell transistor CT is connected to a word line WL and one electrode of the cell transistor CT is connected through the MTJ 40 to a bit line BTL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word line WL to turn on the cell transistor CT. A program current, for example, a write current is applied to the bit line BL and the source line SL. A direction of the write current is determined by a logic state of the MTJ element 40.

In order to perform a read operation of the STT-MRAM cell 30, a logic high voltage is applied to the word line WL to turn on the cell transistor CT, and a read current is supplied to the bit line BL and the source line SL. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 6A:
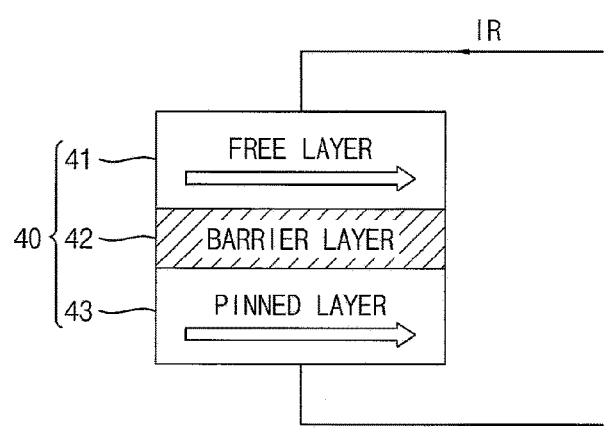
FIGS. 6A and 6B illustrate a magnetization direction according to data written to the MTJ element shown in FIG. 5.
Figure 6B:
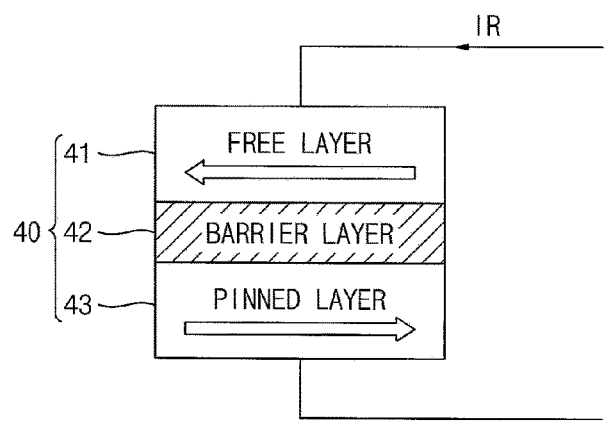

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 6A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

Referring to FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
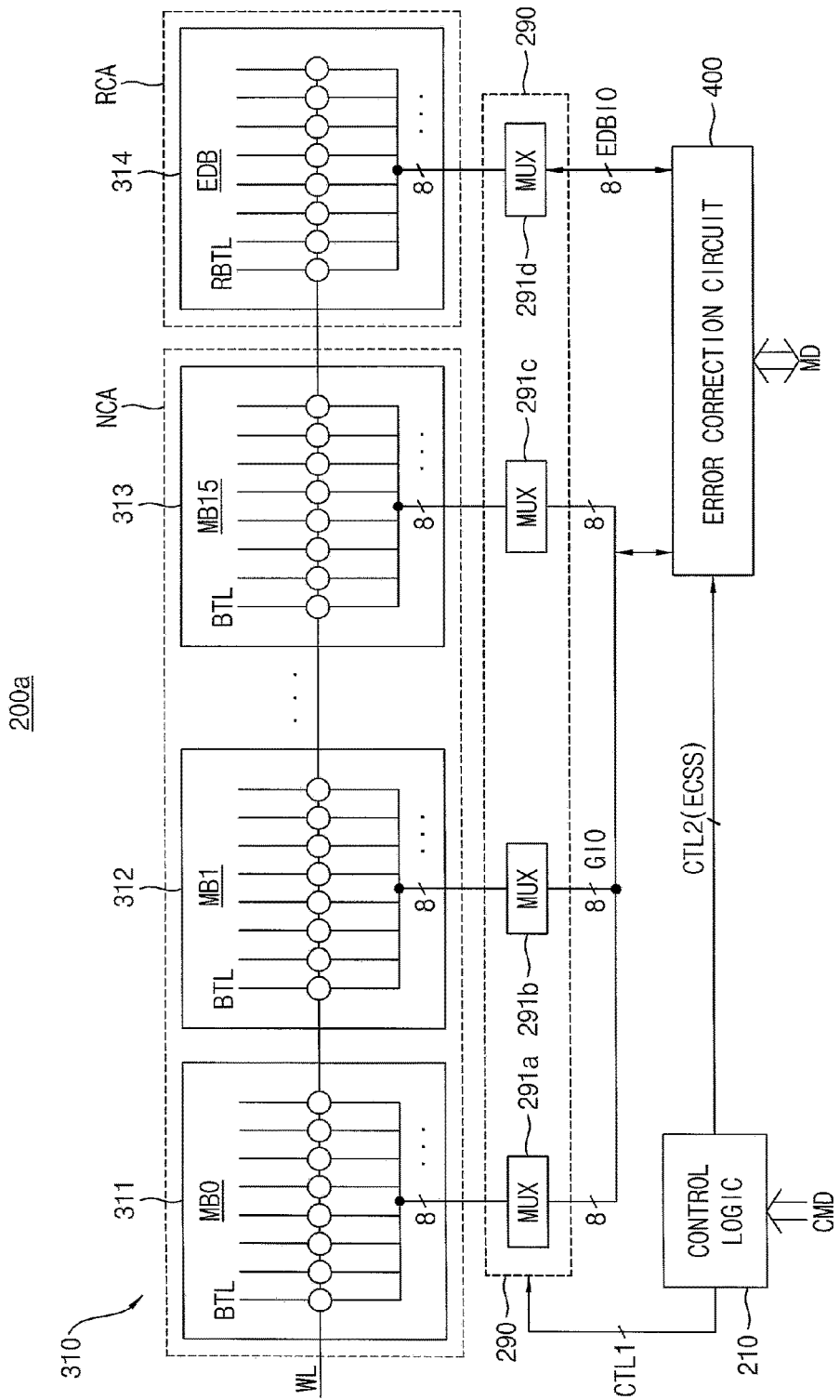
FIG. 7 illustrates a portion of a semiconductor memory device of FIG. 3 in a first engine configuration mode according to example embodiments.

FIG. 7 illustrates a portion of a semiconductor memory device of FIG. 3 in a first engine configuration mode according to example embodiments.

In FIG. 7, the control logic 210, the first bank array 310, the I/O gating circuit 290, and the error correction circuit 400 are illustrated.

Referring to FIG. 7, the first bank array 310 may include a normal cell array NCA and a redundancy cell array RCA. The normal cell array NCA may include a plurality of first memory blocks MB0~MB15, i.e., 311~313, and the redundancy cell array RCA may include at least a second memory block 314. The first memory blocks 311~313 are memory blocks determining a memory capacity of the semiconductor memory device 200*a*. The second memory block 314 is for ECC and/or redundancy repair. Since the second memory block 314 for ECC and/or redundancy repair is used for ECC, data line repair or block repair to repair one or more failed cells generated in the first memory blocks 311~313, the second memory block 314 is also referred to as an EDB block.

In each of the first memory blocks 311~313, a plurality of first memory cells are arrayed in rows and columns. In the second memory block 314, a plurality of second memory cells are arrayed in rows and columns.

In the first memory blocks 311~313, rows may be formed, for example, of 8K word lines WL and columns may be formed, for example, of 1K bit lines BTL. The first memory cells connected to intersections of the word lines WL and the bit lines BTL may be dynamic memory cells or resistive type memory cells. In the second memory block 314, rows may be formed, for example, of 8K word lines WL and columns may be formed, for example, of 1K bit lines BTL. The second memory cells connected to intersections of the word lines WL and the bit lines RBTL may be dynamic memory cells or resistive type memory cells.

The I/O gating circuit 290 may include a plurality of switching circuit 291*a*~291*d* respectively connected to the first memory blocks 311~313 and the second memory block 314. In the semiconductor memory device 200*a*, bit lines corresponding to data of a burst length (BL) may be simultaneously accessed to support the BL indicating the maximum number of column positions that is accessible. For example, if the BL is set to 8, data bits may be set to 128 bits.

The error correction circuit 400 may be connected to the switching circuits 291*a*~291*d* through first data lines GIO and second data lines EDBIO.

The control logic circuit 210 may decode the command CMD to generate the first control signal CTL1 for controlling the switching circuits 291*a*~291*d* and the second control signal CTL2 for controlling the error correction circuit 400. The second control signal CTL2 may include the engine configuration selection signal ECSS.

When the engine configuration selection signal ECSS indicates a first engine configuration mode, the error correction circuit 400 may operate as one ECC engine that performs an ECC encoding on $2^h$-bit write data to generate (h+1)-bit parity data, and performs an ECC decoding on $2^h$-bit read data and (h+1)-bit read parity data. Here, h may be natural number equal to or greater than two. In some embodiments, h may be 7. Therefore, the main data MD includes 128 bits and the parity data includes 8 bits. The 128 bits of main data MD may be stored in the normal cell array NCA and the 8 bits of parity data may be stored in the redundancy cell array RCA. In one embodiment, the 128-bit main data and the 8-bit parity data may be simultaneously output form the first memory blocks 311~313 and the second memory block 314 of FIG. 7 in response to a first address.

Figure 8:
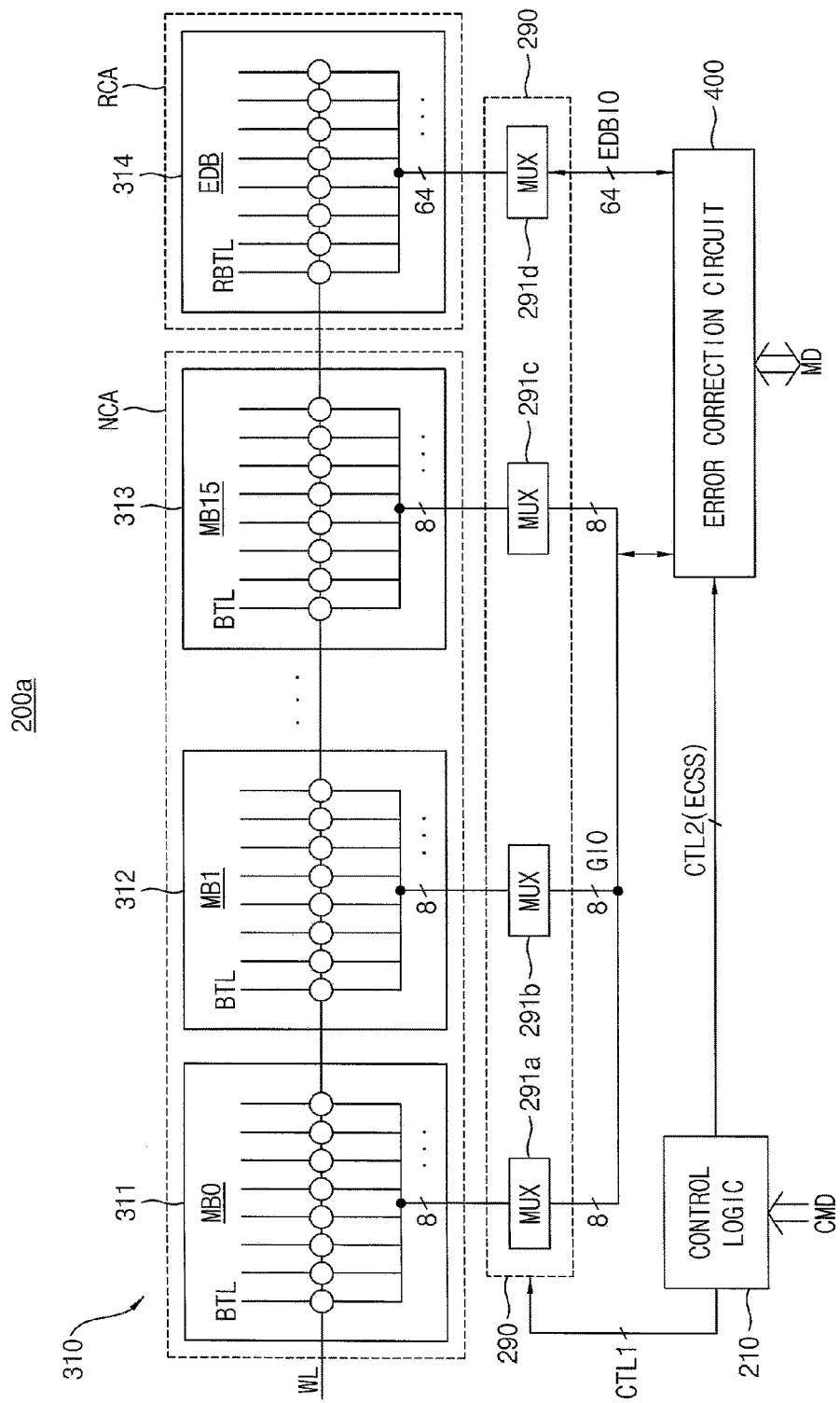
FIG. 8 illustrates a portion of the semiconductor memory device of FIG. 3 in a second engine configuration mode according to example embodiments.

FIG. 8 illustrates a portion of the semiconductor memory device of FIG. 3 in a second engine configuration mode according to example embodiments.

Referring to FIG. 8, when the engine configuration selection signal ECSS indicates a second engine configuration mode, the error correction circuit 400 may operate as a plurality of ECC engines. Each of the ECC engines perform an ECC encoding on $2^f$-bit write data of the $2^h$-bit write data to generate (f+1)-bit parity data, and performs an ECC decoding on $2^f$-bit read data and (f+1)-bit read parity data. Here, f is a natural number smaller than h. In some embodiments, if f is 2, 3, or 4 the number of the ECC engines is 8, 16, or 32, respectively. For example, when the engine configuration selection signal ECSS indicates a second engine configuration mode, the error correction circuit 400 may be implemented with 16 ECC engines which are based on an 8-bit unit ECC engine. Each of the unit ECC engines performs an ECC encoding on 8-bit write data to generate 4-bit parity data and performs an ECC decoding based on 8-bit read data and 4-bit read parity data to correct one error bit in the 8-bit read data.

A group of $2^h$-bit write data (e.g., 128-bit main data) may be stored in the normal cell array NCA through the switching circuits 291*a*, 291*b* and 291*c* and a group of (f+1)-bit parity data (e.g., 64-bit parity data) may be stored in the redundancy cell array RCA through the switching circuit 291*d*.

Figure 9:
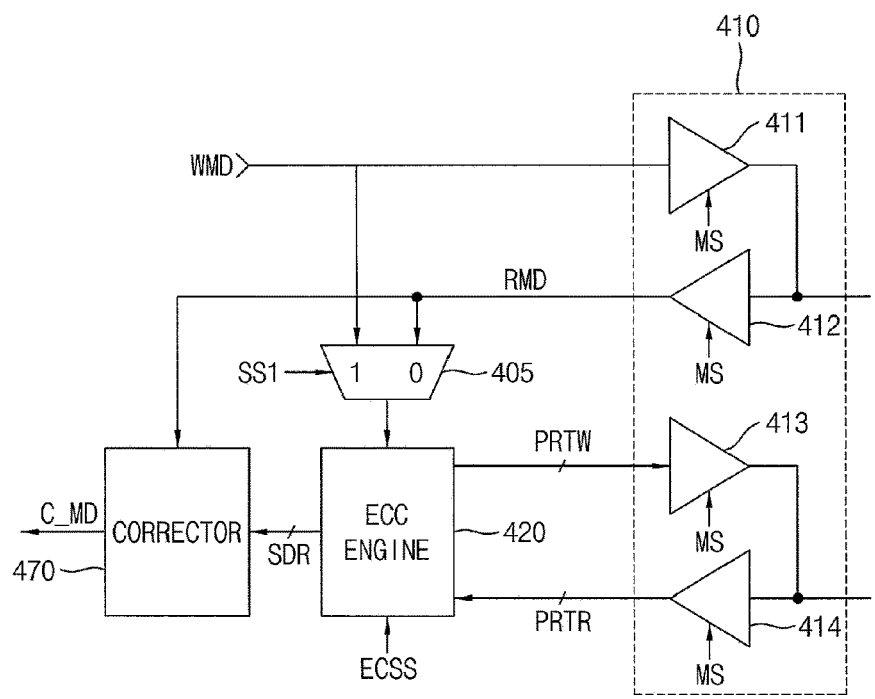
FIG. 9 illustrates an error correction circuit shown in FIG. 3 according to example embodiments.

FIG. 9 illustrates the error correction circuit shown in FIG. 3 according to example embodiments.

Referring to FIG. 9, the error correction circuit 400 may include a multiplexer 405, an ECC engine 420, a buffer unit 410 and a data corrector 470. The buffer unit 410 may include first through fourth buffers 411~414.

The multiplexer 405, in a write operation of the semiconductor memory device 200*a*, provides write data WMD to the ECC engine 420 in response to a first selection signal SS1. The multiplexer 405, in a read operation of the semiconductor memory device 200*a*, provides read data RMD from the buffer 412 to the ECC engine 420 in response to the first selection signal SS1.

The buffers 411 and 413 may be enabled in the write operation in response to a mode signal MS and provide the write data WMD and a parity data PRTW to the I/O gating circuit 290. The parity data PRTW may be output from the ECC engine 420 in the write operation of the semiconductor memory device 200*a*. The buffers 412 and 414 may be enabled in the read operation in response to the mode signal MS, the buffer 412 may provide the read data RMD to the multiplexer 405 and the data corrector 470 and the buffer 414 may provide a parity data PRTR to the ECC engine 420. The parity data PRTR may be output from the I/O gating circuit 290 in the read operation of the semiconductor memory device 200*a*.

The ECC engine 420, in the write operation, may perform an ECC encoding on the write data WMD to provide the parity data PRTW to the buffer 413. The ECC engine 420, in the read operation, may perform an ECC decoding on the read data RMD from the multiplexer 405 based on the parity data PRTR from the buffer 414 to provide syndrome data SDR to the data corrector 470.

The data corrector 470 corrects an error bit in the read data RMD based on the syndrome data SDR from the ECC engine 420 to provide a corrected main data C_MD to the data input/output (I/O) buffer 299.

In FIG. 9, the engine configuration selections signal ECSS, the first selection signal SS1 and the mode signal MS may be included in the second control signal CTL2 from the control logic circuit 210 in FIGS. 7 and 8.

Figure 10:
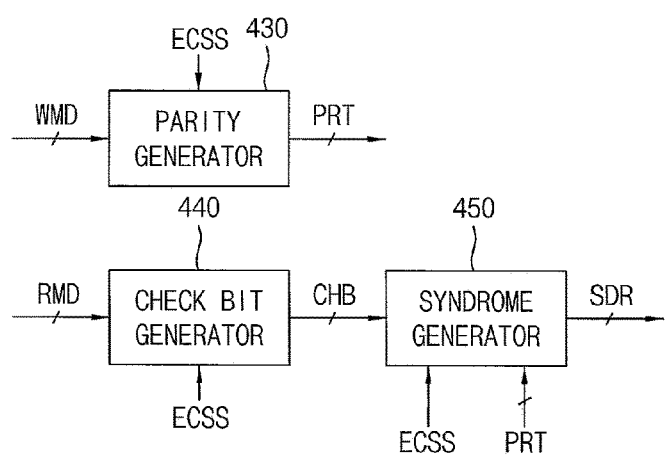
FIG. 10 illustrates an ECC engine in the error correction circuit shown in FIG. 9 according to example embodiments.

FIG. 10 illustrates the ECC engine in the error correction circuit 400 shown in FIG. 9 according to example embodiments.

Referring to FIG. 10, the ECC engine 420 may include a parity generator 430, a check bit generator 440, and a syndrome generator 450.

The parity generator 430 may generate the parity data PRT (e.g., PRTW) based on the write data WMD using an array of exclusive OR gates. The parity generator 430 may include a plurality of sub generators that operate as a whole or individually, in response to the engine selection configuration signal ECSS.

The check bit generator 440 may generate check bits CHB based on the read main data RMD. The check bit generator 440 may include a plurality of sub generators that operate as a whole or individually, in response to the engine selection configuration signal ECSS.

The syndrome generator 450 may generate the syndrome data SDR based on the check bits CHB and the parity data PRT (e.g., PRTR) from the buffer 414. The syndrome generator 450 may include a plurality of sub generators. A number of the sub generators, which are activated may be reconfigurable (adjustable or changeable) in response to the engine selection configuration signal ECSS.

Figure 11:
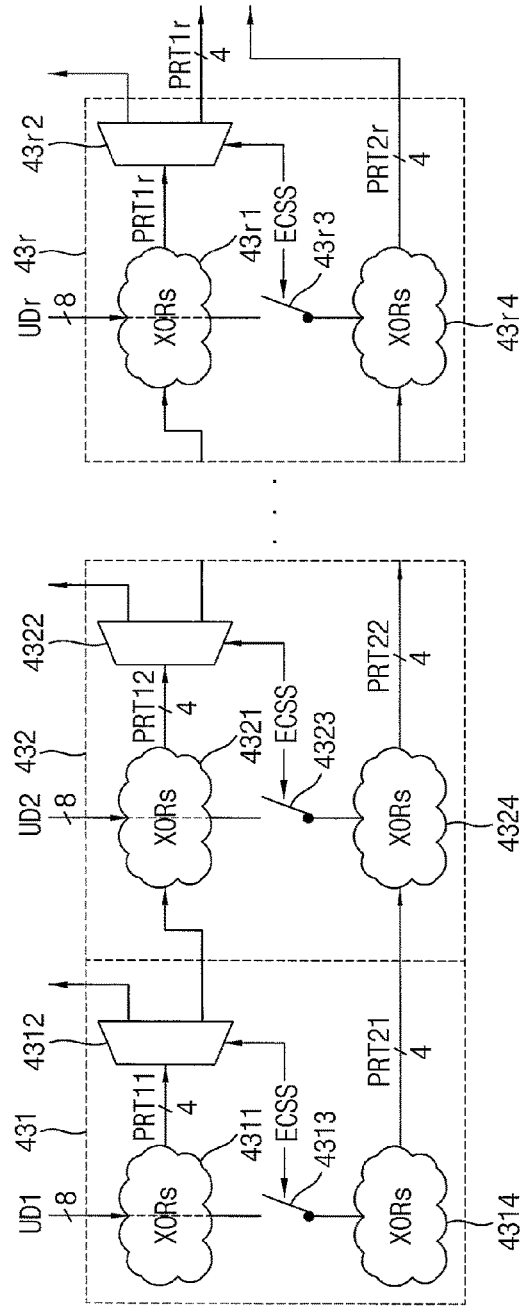
FIG. 11 illustrates a parity generator in the ECC engine of FIG. 10 according to example embodiments.

FIG. 11 illustrates the parity generator 430 in the ECC engine of FIG. 10 according to example embodiments.

Referring to FIG. 11, the parity generator 430 may include a plurality of parity sub generators 431~43r, and r is a natural number greater than two.

The parity sub generators 431~43r may be connected to each other and operate as a whole in the first engine configuration mode or may be separated from each other and operate individually in the second engine configuration mode, in response to the engine configuration selection signal ECSS.

Each of the parity sub generators 431~43r may include corresponding one of first set of XOR modules 4311~43r1, corresponding one of demultiplexers 4312~43r2, corresponding one of switches 4313~43r3 and corresponding one of second set of XOR modules 4314~43r4.

Each of the first set of XOR modules 4311~43r1 may perform an XOR operation on corresponding one of sub data UD1~UDr, which constitute the main data MD (e.g., write data WMD) and may generate corresponding one of first partial parity data PRT11~PRT1r. Each of the switches 4313~43r3 may be connected between corresponding one of the first set of XOR modules 4311~43r1 and corresponding one of the second set of XOR modules 4314~43r4, may provide corresponding one of sub data UD1~UDr to corresponding one of the second set of XOR modules 4314~43r4 in the first engine configuration mode and may be opened in the second configuration mode, in response to the engine configuration selection signal ECSS. The second set of XOR modules 4314~43r4 may be sequentially connected to each other in the first engine configuration mode. Each of the second set of XOR modules 4314~43r4 performs an XOR operation on corresponding one of sub data UD1~UDr and may generate corresponding one of second partial parity data PRT21~PRT2r sequentially.

Each of the demultiplexers 4312~43r2 may provide corresponding one of the first partial parity data PRT11~PRT1r to a first path in the first engine configuration mode and may provide corresponding one of the first partial parity data PRT11~PRT1r to a second path in the second engine configuration mode, in response to the engine configuration selection signal ECSS. In the first engine configuration mode, the parity sub generators 431~43r may be sequentially connected to each other through the first path of each of the parity sub generators 431~43r, may provide each of the first partial parity data PRT11~PRT1r to a corresponding next parity sub generator through the first path, and may provide each of the second partial parity data PRT21~PRT2r to the corresponding next parity sub generator. In example embodiments, in the first engine configuration mode, each of the parity sub generators 431~43r may provide p-bit parity sub data (e.g., one of the first partial parity data PRT11~PRT1r and one of the second partial parity data PRT21~PRT2r) on a first set of output lines of a corresponding parity sub generator, and each of the parity sub generators 431~43r may be connected to each other through the first set of output lines of the corresponding parity sub generator. For example, a number of units for which ECC is performed may be one in the first engine configuration mode. In example embodiments, in the second engine configuration mode, the parity sub generators 431~43r may be separated from each other and provide the first partial parity data PRT11~PRT1r individually. In example embodiments, in the second engine configuration mode, each of the parity sub generators 431~43r may provide q-bit parity data (e.g., one of the first partial parity data PRT11~PRT1r) on a second set of output lines of each of the parity sub generators 431~43r. For example, a number of units for which ECC is performed may be 16 in the second engine configuration mode.

Figure 12:
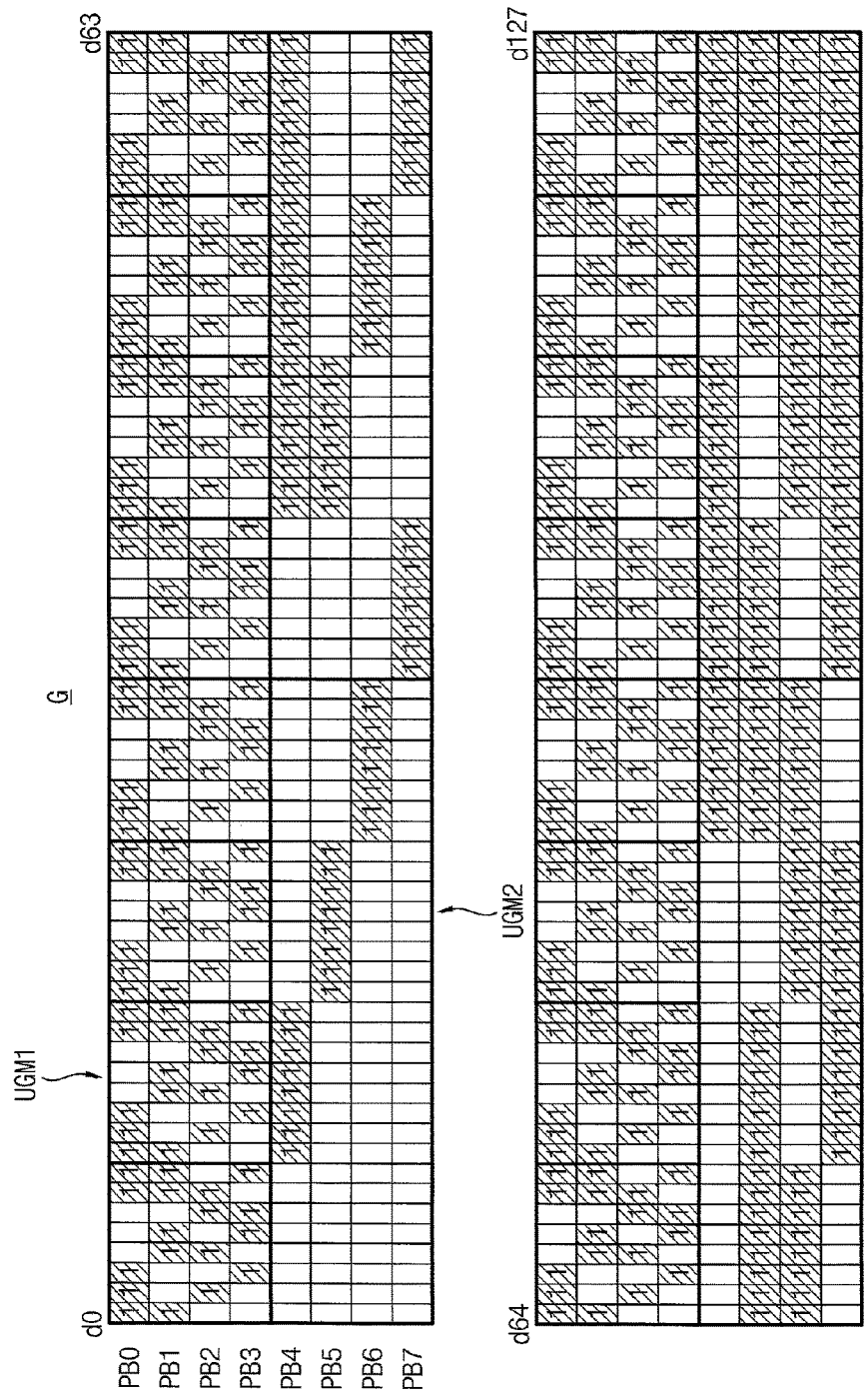
FIG. 12 illustrates an example of a generation matrix that is used when the parity generator of FIG. 11 generates parity data according to example embodiments.

FIG. 12 illustrates an example of a generation matrix that is used when the parity generator of FIG. 11 generates the parity data according to example embodiments.

Referring to FIG. 12, a generation matrix G may include a plurality of first unit generation matrixes UGM1 and a plurality of second unit generation matrixes UGM2. For example, a number of the first unit generation matrixes UGM1 may be 16 and a number of the second unit generation matrixes UGM2 may be 4.

Each of the first unit generation matrixes UGM1 may correspond to a corresponding one of the parity sub generators 431~43r, and each of the parity sub generators 431~43r may perform an XOR operation on corresponding one of the sub data UD1~UDr to generate corresponding one of the first partial parity data PRT11~PRT1r using corresponding one of the first unit generation matrixes UGM1, in the second engine configuration mode. The first unit generation matrixes UGM1 and the second unit generation matrixes UGM2 may correspond to all of the parity sub generators 431~43r and may be used for generating the first partial parity data PRT11~PRT1r and the second partial parity data PRT21~PRT2r in the first engine configuration mode. In FIG. 12, data bits d0~d127 denote data bits of the main data MD.

Figure 13:
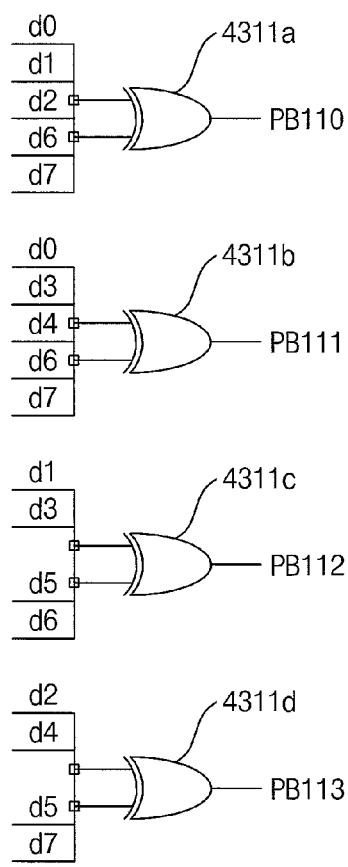
FIG. 13 illustrates one of a first set of XOR modules in the parity generator of FIG. 11 according to example embodiments.

FIG. 13 illustrates one of the first set of XOR modules in the parity generator of FIG. 11 according to example embodiments.

Referring to FIG. 13, the first XOR module 4311 may include a plurality of XOR gates 4311a~4311d. Each of the XOR gates 4311a and 4311b has five input terminals and each of XOR gates 4311c and 4311d has four input terminals.

The XOR gate 4311a may perform an XOR operation on the data bits d0, d1, d2, d6, d7 to generate a parity bit PB110, the XOR gate 4311b may perform an XOR operation on the data bits d0, d3, d4, d6, d7 to generate a parity bit PB111, the XOR gate 4311c may perform an XOR operation on the data bits d1, d3, d5, d6 to generate a parity bit PB112, and the XOR gate 4311d may perform an XOR operation on the data bits d2, d4, d5, d7 to generate a parity bit PB113. The parity bits PB110, PB111, PB112 and PB113 may constitute the first partial parity data PRT11.

Each of the first set of XOR modules 4321~43r1 may have substantially the same configuration as a configuration of the first XOR module 4311.

Figure 14:
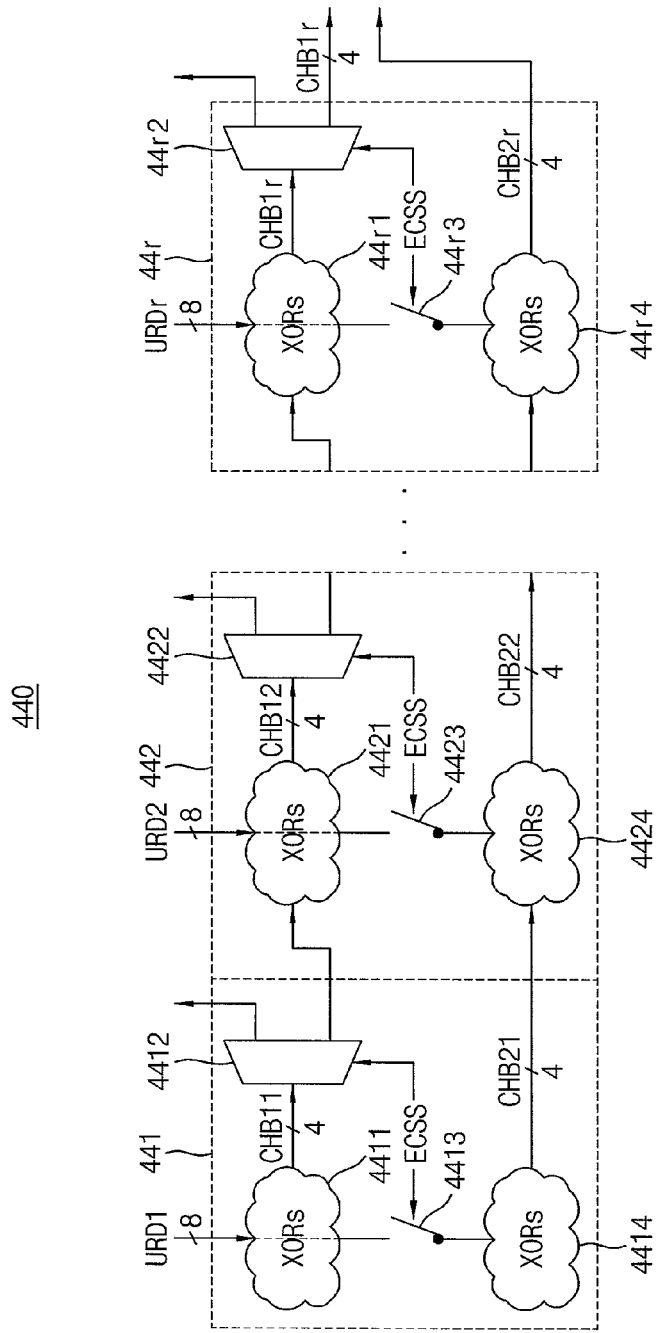
FIG. 14 illustrates a check bit generator in the ECC engine of FIG. 10 according to example embodiments.

FIG. 14 illustrates the check bit generator 440 in the ECC engine of FIG. 10 according to example embodiments.

Referring to FIG. 14, the check bit generator 440 may include a plurality of check bit sub generators 441~44r.

The check bit sub generators 441~44r may be connected to each other and operate in the first engine configuration mode or may be separated from each other and operate individually in the second engine configuration mode, in response to the engine configuration selection signal ECSS.

Each of the check bit sub generators 441~44r may include corresponding one of a first set of XOR modules 4411~44r1, corresponding one of demultiplexers 4412~44r2, corresponding one of switches 4413~44r3 and corresponding one of second set of XOR modules 4414~44r4.

Each of the first set of XOR modules 4411~44r1 may perform an XOR operation on corresponding one of sub read data URD1~URDr, which constitute the read data RMD and may generate corresponding one of first partial check bits CHB11~CHB1r. Each of the switches 4413~44r3 may be connected between corresponding one of the first set of XOR modules 4411~44r1 and corresponding one of the second XOR modules 4414~44r4, may provide corresponding one of sub read data URD1~URDr to corresponding one of the second set of XOR modules 4412~44r2 in the first engine configuration mode and may be opened in the second configuration mode, in response to the engine configuration selection signal ECSS. The second set of XOR modules 4414~44r4 may be sequentially connected to each other in the first engine configuration mode. Each of the second XOR modules 4414~44r4 performs an XOR operation on corresponding one of sub read data URD1~URDr and may generate corresponding one of second partial check bits CHB21~CHB2r sequentially.

Each of the demultiplexers 4412~44r2 may provide corresponding one of the first partial check bits CHB11~CHB1r to a first path in the first engine configuration mode and may provide corresponding one of the first partial check bits CHB11~CHB1r to a second path in the second engine configuration mode, in response to the engine configuration selection signal ECSS. In the first engine configuration mode, the check bit sub generators 441~44r may be sequentially connected to each other through the first path of each of the check bit sub generators 441~44r, may provide each of the first partial check bits CHB11~CHB1r to a corresponding next check bit sub generator through the first path, and may provide each of the second partial check bits CHB21~CHB2r to the corresponding next check bit sub generator. In example embodiments, in the first engine configuration mode, each of the check bit sub generators 441~44r may provide p-bit check bit sub data (e.g., one of the first partial check bits CHB11~CHB1r and one of the second partial check bits CHB21~CHB2r) on a first set of output lines of a corresponding check bit sub generator, and each of the check bit sub generators 441~44r may be connected to each other through the first set of output lines of the corresponding check bit sub generator. In example embodiments, in the second engine configuration mode, the check bit sub generators 441~44r may be separated from each other and provide the first partial check bits CHB11~CHB1r individually. In example embodiments, in the second engine configuration mode, each of the check bit sub generators 441~44r may provide q-bit check bits (e.g., one of the first partial check bits CHB11~CHB1r) on a second set of output lines of each of the check bit sub generators 441~44r.

Figure 15:
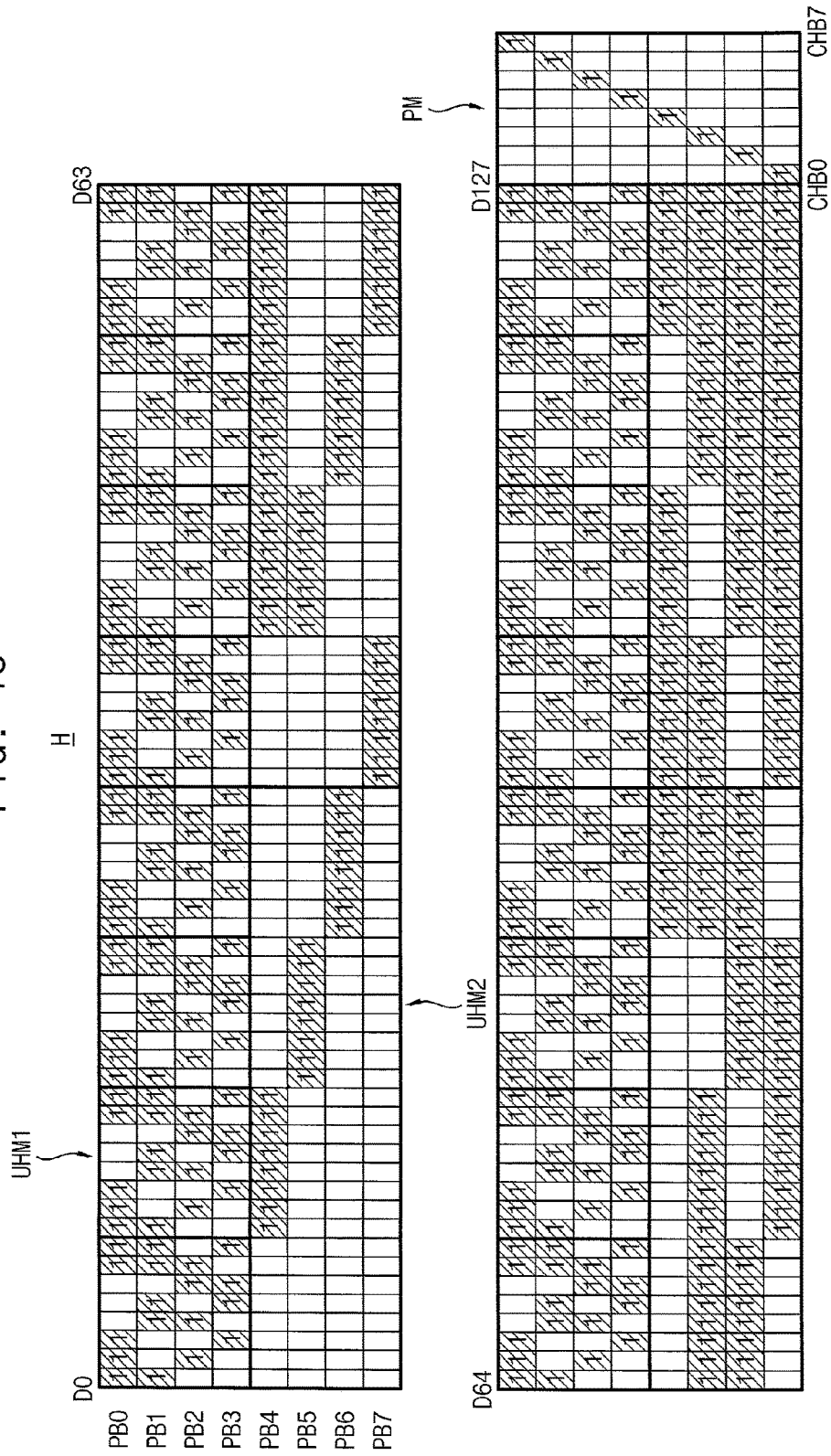
FIG. 15 illustrates an example of a check matrix that is used when the check bit generator of FIG. 14 generates check bits according to example embodiments.

FIG. 15 illustrates an example of a check matrix that is used when the check bit generator of FIG. 14 generates the check bits according to example embodiments.

Referring to FIG. 15, a check matrix H may include a plurality of first unit check matrixes UHM1, a plurality of second unit check matrixes UHM2 and a parity matrix PM. For example, a number of the first unit check matrixes UHM1 may be 16 and a number of the second unit check matrixes UHM2 may be 4.

Each of the first unit check matrixes UHM1 may correspond to corresponding one of the check bit sub generators 441~44r, and each of the check bit sub generators 441~44r may perform an XOR operation on corresponding one of the sub read data URD1~URDr to generate corresponding one of the first partial check bits CHB11~CHB1r using corresponding one of the first unit check matrixes UHM1, in the second engine configuration mode. The first unit check matrixes UHM1 and the second unit check matrixes UHM2 may correspond to all of the check bit sub generators 441~44r and may be used for generating the first partial check bits CHB11~CHB1r and the second check bits CHB21~CHB2r in the first engine configuration mode. In FIG. 15, data bits D0~D127 denote data bits of the read data RMD.

Figure 16A:
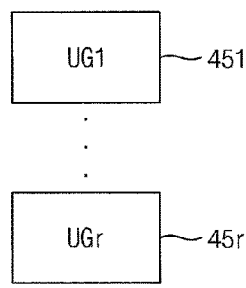
FIG. 16A illustrates a syndrome generator in the ECC engine shown in FIG. 10 according to example embodiments.

FIG. 16A illustrates the syndrome generator in the ECC engine shown in FIG. 10 according to example embodiments.

Referring to FIG. 16A, the syndrome generator 450 may include a plurality of syndrome sub generators 451~45r. All or some of the syndrome sub generators 451~45r may be activated in response to the engine configuration selection signal ECSS. For example, when the engine configuration selection signal ECSS indicates the first engine configuration mode, the first and second syndrome sub generators 451 and 452 of the syndrome sub generators 451~45r may be activated. For example, when the engine configuration selection signal ECSS indicates the second engine configuration mode, all of the syndrome sub generators 451~45r may be activated.

Figure 16B:
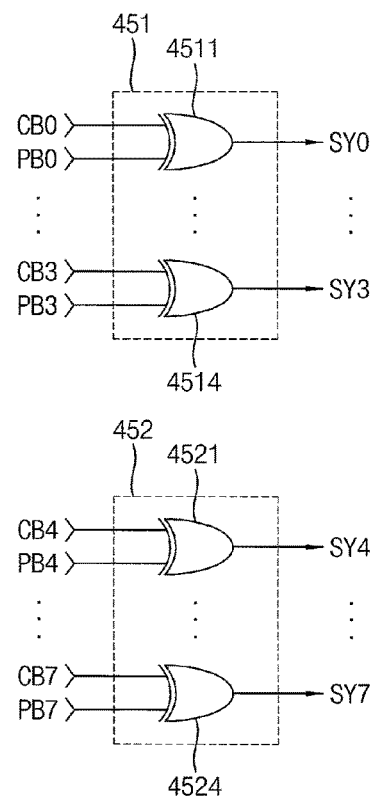
FIG. 16B illustrates the syndrome generator of FIG. 16A in the first engine configuration mode according to example embodiments.

FIG. 16B illustrates the syndrome generator of FIG. 16A in the first engine configuration mode according to example embodiments.

Referring to FIG. 16B, in the first engine configuration mode, the first and second syndrome sub generators 451 and 452 of the syndrome sub generators 451~45r may be activated. The first syndrome sub generator 451 may include XOR gates 4511~4514 and the second syndrome sub generators 452 may include XOR gates 4521~4524. Each of the XOR gates 4511~4514 performs an XOR operation on corresponding one of the check bits CB0~CB3 and corresponding one of the parity bits PB0~PB3 to generate corresponding one of syndromes SY0~SY3. Each of the XOR gates 4521~4524 performs an XOR operation on corresponding one of the check bits CB4~CB7 and corresponding one of the parity bits PB4~PB7 to generate corresponding one of syndromes SY4~SY7. Therefore, the syndrome generator 450 may generate syndromes SY0~SY7, each having a logic level determined based on whether corresponding one of the check bits CB0~CB7 is the same as corresponding one of the parity bits PB0~PB7 in the first engine configuration mode. For example, when the check bit CB0 is not the same as the parity bit PB0, the syndrome SY0 has a first logic level (a logic high level). For example, when the check bit CB7 is the same as the parity bit PB7, the syndrome SY7 has a second logic level (a logic low level). The syndromes SY0~SY7 may constitute the syndrome data SDR of FIG. 10.

Figure 16C:
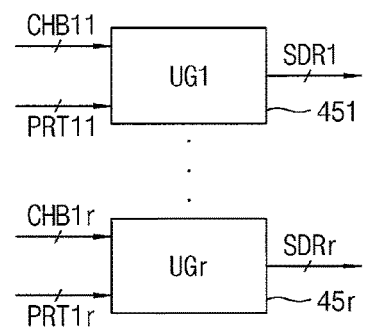
FIG. 16C illustrates the syndrome generator of FIG. 16A in the second engine configuration mode according to example embodiments.

FIG. 16C illustrates the syndrome generator of FIG. 16A in the second engine configuration mode according to example embodiments.

Referring to FIG. 16C, in the second engine configuration mode, all of the syndrome sub generators 451~45r may be activated. Each of the syndrome sub generators 451~45r performs an XOR operation on corresponding one of the first partial check bits CHB11~CHB1r and corresponding one of the first partial parity data PRT11~PRT1r to generate corresponding one of a plurality of partial syndrome data SDR1~SDRr. Each of the syndrome sub generators 451~45r may include four XOR gates.

Figure 17:
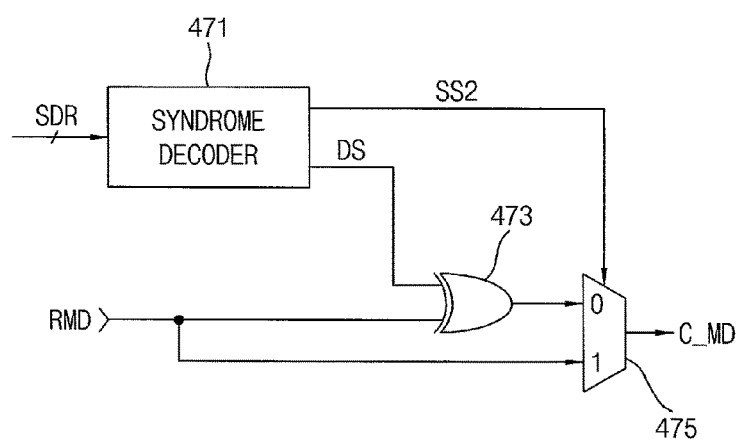
FIG. 17 illustrates a data corrector in the error correction circuit in FIG. 9 according to example embodiments.

FIG. 17 illustrates the data corrector in the error correction circuit in FIG. 9 according to example embodiments.

Referring to FIG. 17, the data corrector 470 may include a syndrome decoder 471, a bit inverter 473 and a selection circuit 475 which is implemented by a multiplexer.

The syndrome decoder 471 may decode the syndrome data SDR to generate a decoding signal DS and a second selection signal SS2. The decoding signal DS may indicate a position of the at least one error bit and the second selection signal SS2 may have a logic level depending on a number of the at least one error bit. The bit inverter 473 may invert the at least one error bit in response to the decoding signal DS. The selection circuit 475 may select one of the read data RMD and an output of the bit inverter 473 to provide the corrected main data C_MD in response to the second selection signal SS2.

The syndrome decoder 471 may output the second selection signal SS2 with a first logic level (e.g., logic high level) when a number of the at least one error bit in the read data RMD exceeds the error correction capability of the ECC based on the syndrome data SDR. The selection circuit 475 may provide the read data RMD as the corrected main data C_MD in response to the second selection signal SS2 having the first logic level. The syndrome decoder 471 may output the decoding signal DS with the first logic level and output the second selection signal SS2 with a second logic level (e.g., logic low level) when a number of the at least one error bit in the read data RMD is within the error correction capability of the ECC based on the syndrome data SDR. The bit inverter 473 may invert the at least one error bit in response to the decoding signal DS having the first logic level. The selection circuit 475 may provide the output of the bit inverter 473 as the corrected main data C_MD in response to the second selection signal SS2 having the second logic level.

FIGS. 18A through 18D illustrate various configuration of the ECC engine in FIG. 10 according to the engine configuration selection signal according to example embodiments.

Figure 18A:
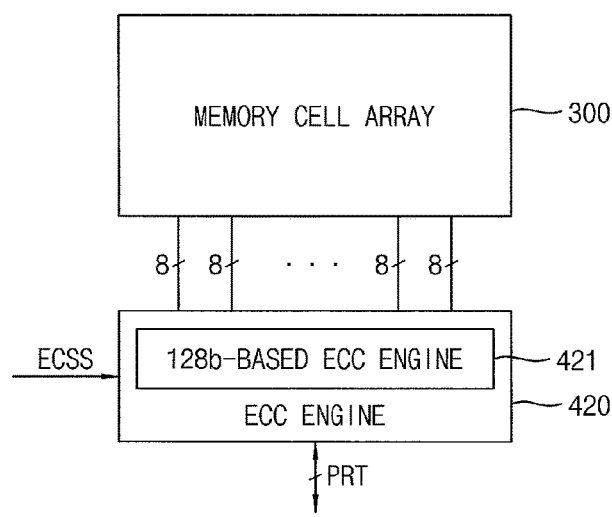
FIGS. 18A through 18D illustrate various configuration of the ECC engine in FIG. 10 according to the engine configuration selection signal according to example embodiments.

Referring to FIG. 18A, the ECC engine 420 may be implemented with one 128-bit based ECC engine 421 in response to the engine configuration selection signal ECSS. The 128-bit based ECC engine 421 may perform an ECC encoding on 128-bit data to generate 8-bit parity data PRT and may perform ECC decoding based on the 128-bit data and the 8-bit parity data PRT. For example, the 128-bit based ECC engine 421 may correct one error bit in the 128-bit data based on the 8-bit parity data PRT. For example, a number of units for which ECC is performed may be one in response to the engine configuration selection signal ECSS.

Figure 18B:
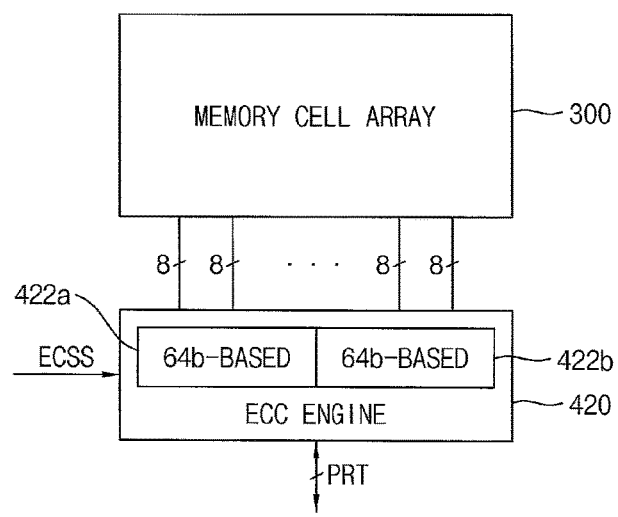

Referring to FIG. 18B, the ECC engine 420 may be implemented with two 64-bit based ECC engines 422a and 422b in response to the engine configuration selection signal ECSS. Each of the 64-bit based ECC engines 422a and 422b may perform an ECC encoding on 64-bit data to generate 8-bit parity data PRT and may perform ECC decoding based on the 64-bit data and the 8-bit parity data PRT. For example, each of the 64-bit based ECC engines 422a and 422b may correct one error bit in the 64-bit data and 8-bit parity data PRT, and may detect two error bits in the 64-bit data based on the 8-bit parity data PRT. For example, a number of units for which ECC is performed may be 2 in response to the engine configuration selection signal ECSS.

Figure 18C:
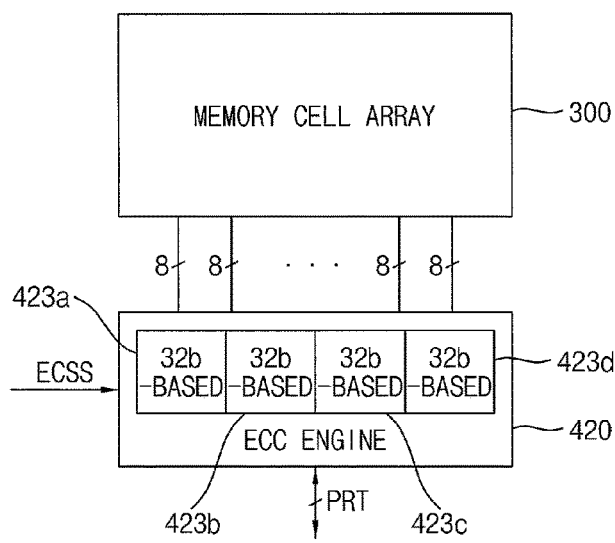

Referring to FIG. 18C, the ECC engine 420 may be implemented with four 32-bit based ECC engines 423a~423d in response to the engine configuration selection signal ECSS. Each of the 32-bit based ECC engines 423a~423d may perform an ECC encoding on 32-bit data to generate 7-bit parity data PRT and may perform ECC decoding based on the 32-bit data and the 7-bit parity data PRT. For example, each of the 32-bit based ECC engines 423a~423d may correct one error bit in the 32-bit data and the 7-bit parity data PRT, and may detect two error bits in the 32-bit data based on the 7-bit parity data PRT. For example, a number of units for which ECC is performed may be 4 in response to the engine configuration selection signal ECSS.

Figure 18D:
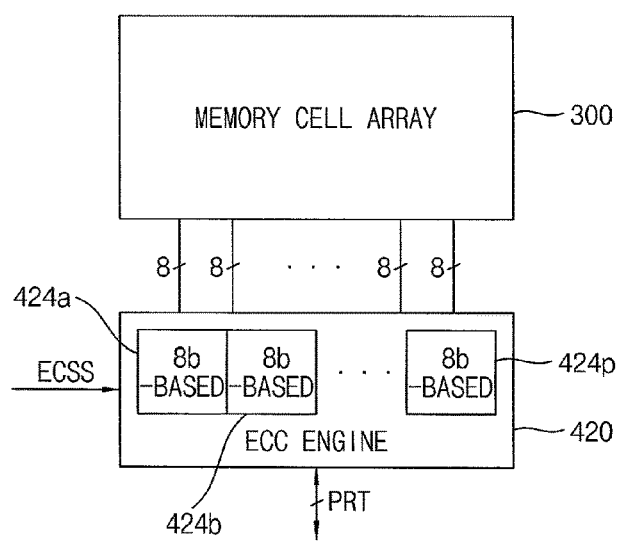

Referring to FIG. 18D, the ECC engine 420 may be implemented with sixteen 8-bit based ECC engines 424a~424p in response to the engine configuration selection signal ECSS. Each of the 8-bit based ECC engines 424a~424p may perform an ECC encoding on 8-bit data to generate 4-bit parity data PRT and may perform ECC decoding based on the 8-bit data and the 4-bit parity data PRT. For example, each of the 8-bit based ECC engines 424a~424p may correct one error bit in the 8-bit data and the 4-bit parity data PRT. For example, a number of units of ECC performing may be 16 in response to the engine configuration selection signal ECSS.

Figure 19:
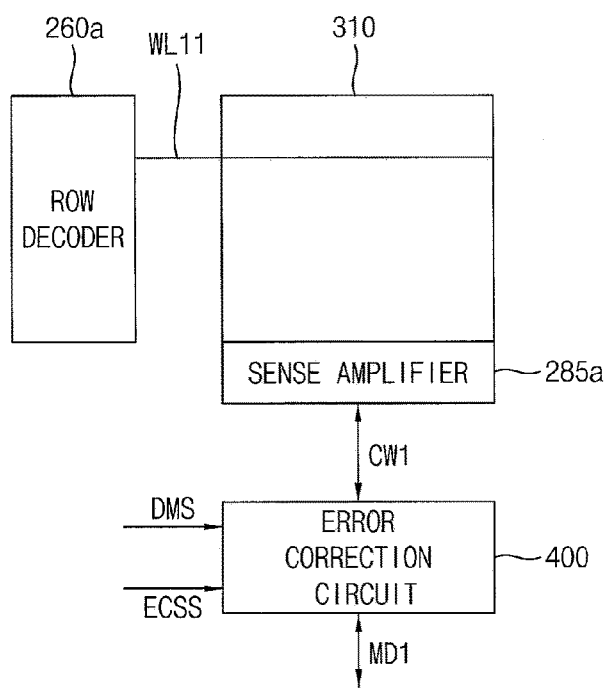
FIG. 19 illustrates the semiconductor memory device of FIG. 3 in a first engine configuration mode and a first density mode according to example embodiments.

FIG. 19 illustrates the semiconductor memory device of FIG. 3 in a first engine configuration mode and a first density mode according to example embodiments.

In FIG. 19, the first bank array 310, circuit components 260a and 285a associated with the first bank array 310 and the error correction circuit 400 are illustrated.

Referring to FIGS. 3, 7 and 19, when the command CMD applied to the semiconductor memory device 200a designates the first engine configuration mode and the first density mode of the semiconductor memory device 200a, the control logic circuit 210 may provide the error correction circuit 400 with the engine configuration selection signal ECSS indicating the first engine configuration mode and a density mode signal DMS indicating the first density mode.

In a write operation of the first engine configuration mode and the first density mode, the error correction circuit 400 encodes a main data MD1 to generate a parity data and writes a codeword CW1 including the main data MD1 and the parity data in memory cells connected to a word line WL11 in the first bank array 310. In a read operation of the first engine configuration mode and the first density mode, the error correction circuit 400 reads the codeword CW1 from the memory cells connected to the word line WL11 in the first bank array 310, corrects an error bit in the codeword CW1 and outputs the error-corrected main data MD 1.

Figure 20:
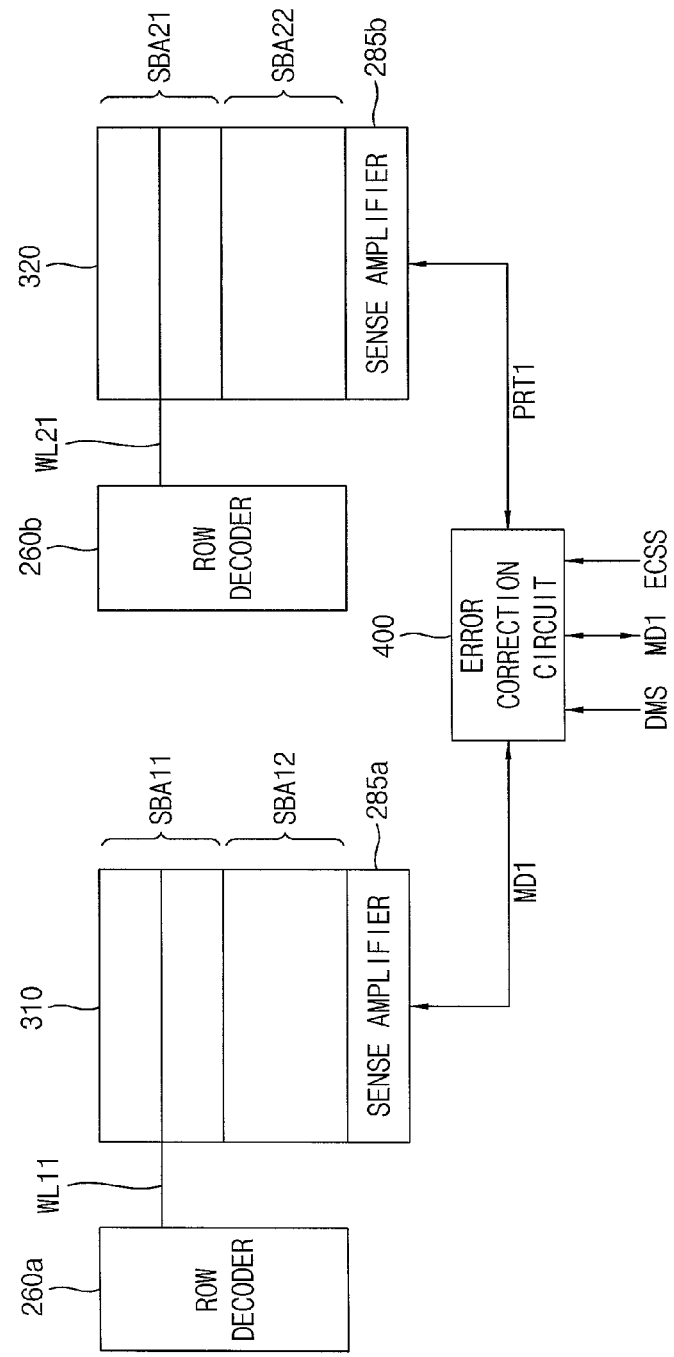
FIG. 20 illustrates the semiconductor memory device of FIG. 3 in a second engine configuration mode and a second density mode according to example embodiments.

FIG. 20 illustrates the semiconductor memory device of FIG. 3 in a second engine configuration mode and a second density mode according to example embodiments.

In FIG. 20, the first bank array 310, circuit components 260a and 285a associated with the first bank array 310, the second bank array 320, circuit components 260b and 285b associated with the second bank array 320 and the error correction circuit 400 are illustrated.

In FIG. 20, the first bank array 310 includes a first sub array SBA11 and a second sub array SBA12 and the second bank array 320 includes a first sub array SBA21 and a second sub array SBA22.

Referring to FIGS. 3, 8 and 20, when the command CMD applied to the semiconductor memory device 200a designates the second engine configuration mode and the second density mode of the semiconductor memory device 200a, the control logic circuit 210 may provide the error correction circuit 400 with the engine configuration selection signal ECSS indicating the second engine configuration mode and the density mode signal DMS indicating the second density mode.

In a write operation of the second engine configuration mode and the second density mode, the error correction circuit 400 operates as a plurality of ECC engines as described above, generates a parity data PRT1 based on the main data MD1, stores the main data MD1 in memory cells connected to a word line WL11 of the first sub array SBA11 of the first bank array 310 and stores the parity data PRT1 in memory cells connected to a word line WL21 of the first sub array SBA21 of the second bank array 320.

In a read operation of the second engine configuration mode and the second density mode, the error correction circuit 400 operates as a plurality of ECC engines as described above, receives the main data MD1 from the memory cells connected to the word line WL11 of the first sub array SBA11 of the first bank array 310 and receives the parity data PRT1 from the memory cells connected to the word line WL21 of the first sub array SBA21 of the second bank array 320. The error correction circuit 400 corrects an error bit in the main data MD1 and the parity data PRT1 and outputs the error-corrected main data MD1. In example embodiments, the word lines WL11 and WL21 may be selected in response to the same address output from the address register 220.

In FIG. 20, each of the second sub array SBA12 of the first bank array 310 and the second sub array SBA22 of the second bank array 320 may include at least one defective memory cell.

Figure 21:
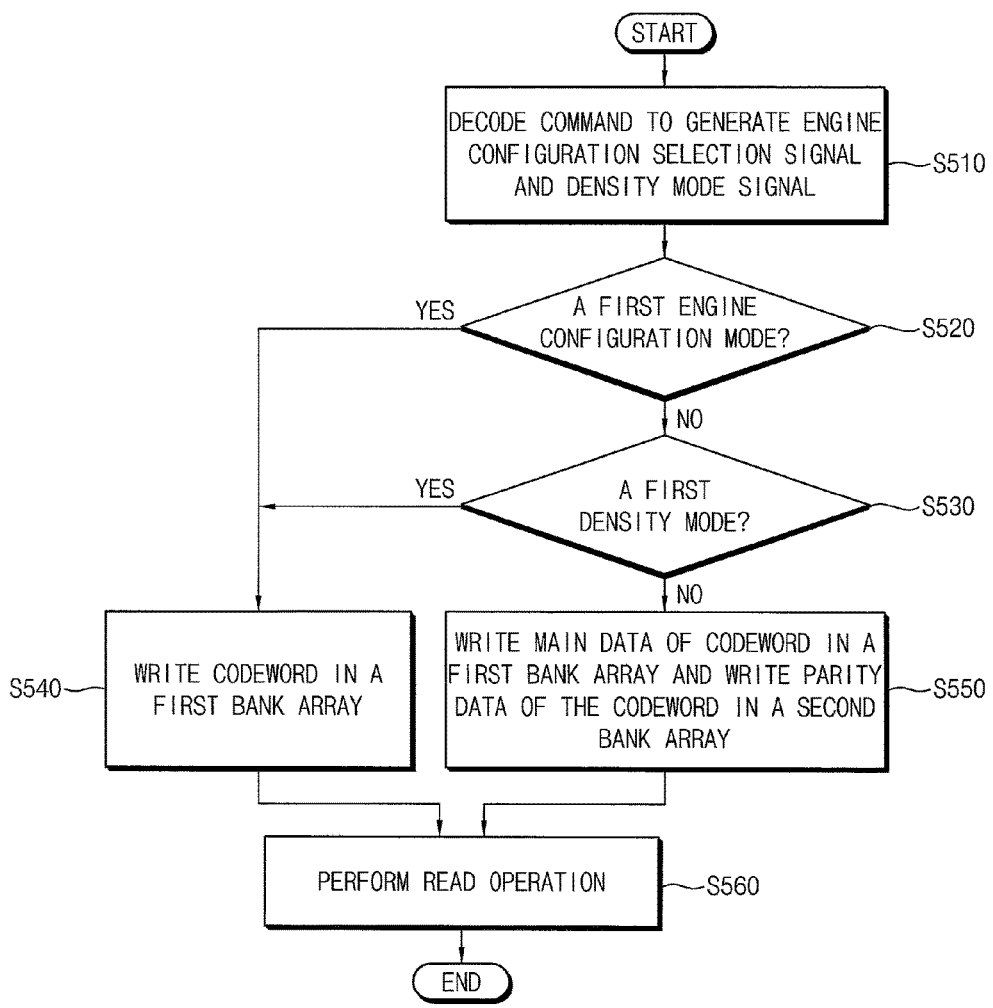
FIG. 21 is a flow chart illustrating a method of operating a semiconductor memory device according to example embodiments.

FIG. 21 is a flow chart illustrating a method of operating a semiconductor memory device according to example embodiments.

Referring to FIGS. 2 through 21, in a method of operating a semiconductor memory device 200a that includes a memory cell array 300 having a plurality of bank arrays 310~340, a control logic circuit 210 controlling access to the memory cell array 300 and an error correction circuit 400, the control logic circuit 210 generates the engine configuration selection signal ECSS and the density mode signal DMS by decoding a command DMS (S510).

The error correction circuit 400 determines whether the engine configuration selection signal ECSS designates a first engine configuration mode (S520). When the engine configuration selection signal ECSS does not designate the first engine configuration mode (NO in S520), the error correction circuit 400 determines whether the density mode signal DMS designates a first density mode (S530). When the density mode signal DMS does not designate the first density mode (NO in S530), the error correction circuit 400 operates as a plurality of ECC engines as described above, generates a parity data based on a main data, stores the main data in the first bank array 310 and stores the parity data in the second bank array 320 different from the first bank array 310 (S550).

When the engine configuration selection signal ECSS designates the first engine configuration mode (YES in S520) and the density mode signal DMS designates the first density mode (YES in S530), the error correction circuit 400 operates as one ECC engine and writes the codeword including the main data and the parity data in one of the bank arrays 310~340.

After the write operation is completed, the read operation is performed on the memory cell array 300 in response to a read command from the memory controller 100.

Figure 22:
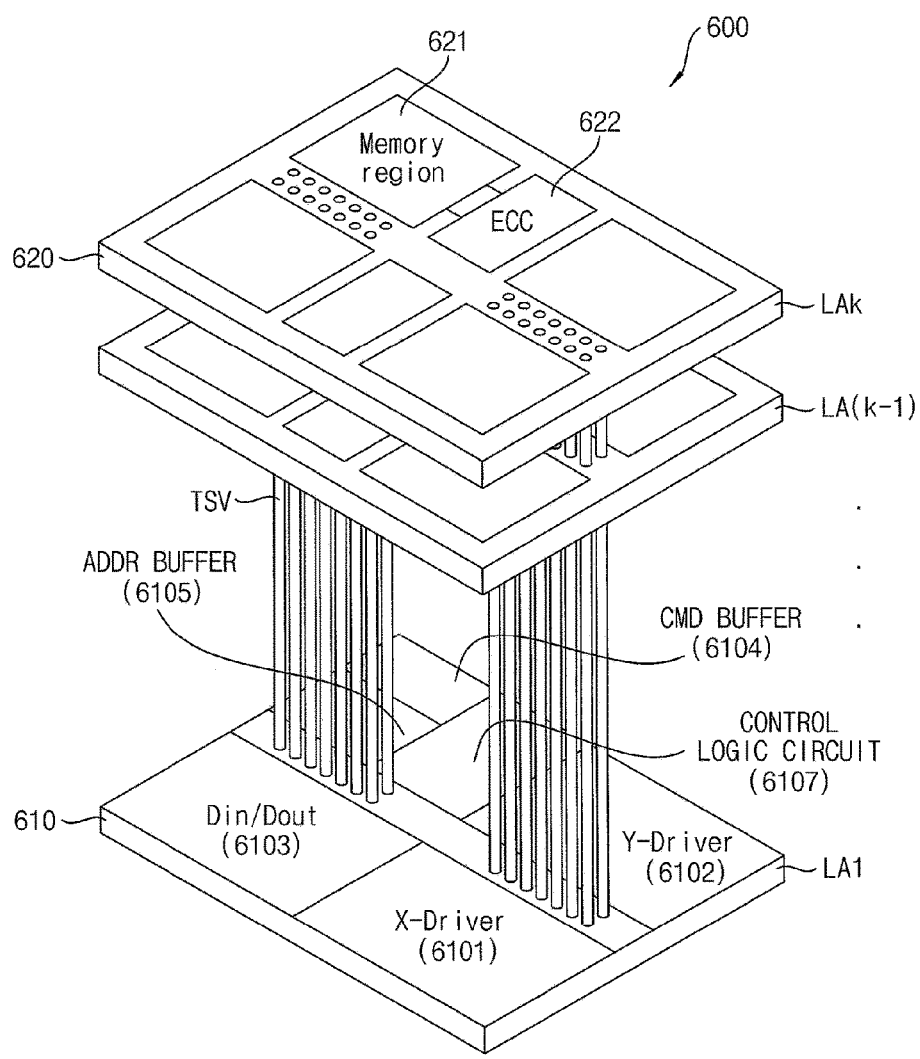
FIG. 22 is a structural diagram illustrating a semiconductor memory device according to example embodiments.

FIG. 22 is a structural diagram illustrating a semiconductor memory device according to example embodiments.

Referring to FIG. 22, a semiconductor memory device 600 may include first through kth semiconductor integrated circuit layers LA1 through LAk (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-substrate vias (e.g., through-silicon vias) TSVs. The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving word lines of a memory, a column (Y)-driver 6102 for driving bit lines of the memory, a data input/output unit (Din/Dout) 6103 for controlling input/output of data, a command (CMD) buffer 6104 for receiving a command CMD from outside and buffering the command CMD, and an address (ADDR) buffer (or address register) 6105 for receiving an address from outside and buffering the address. The memory region 621 may include a plurality of bank arrays in which a plurality of memory cells are arranged as described with reference to FIGS. 3, 7 and 8.

The first semiconductor integrated circuit layer 610 may further include a control logic circuit 6107. The control logic circuit 6107 may access the memory region 621 and may generate control signals for accessing the memory region 621 based on the command from the memory controller.

The kth semiconductor integrated circuit layer 620 may include an error correction circuit 622 that performs an ECC encoding on data to be stored in the memory region 621 and performs an ECC decoding on data read from the memory region 621. The error correction circuit 622 may be the same as the error correction circuit 400 disclosed above. The error correction circuit 622 operates as one ECC engine and performs an ECC encoding and an ECC decoding in a first engine configuration mode or operates as a plurality of ECC engines individually operating and performs an ECC encoding and an ECC decoding in a second engine configuration mode, in response to an engine configuration selection signal. In addition, the error correction circuit may store a parity data in different bank arrays in a first density mode or a second density mode in response to a density mode signal.

Figure 23:
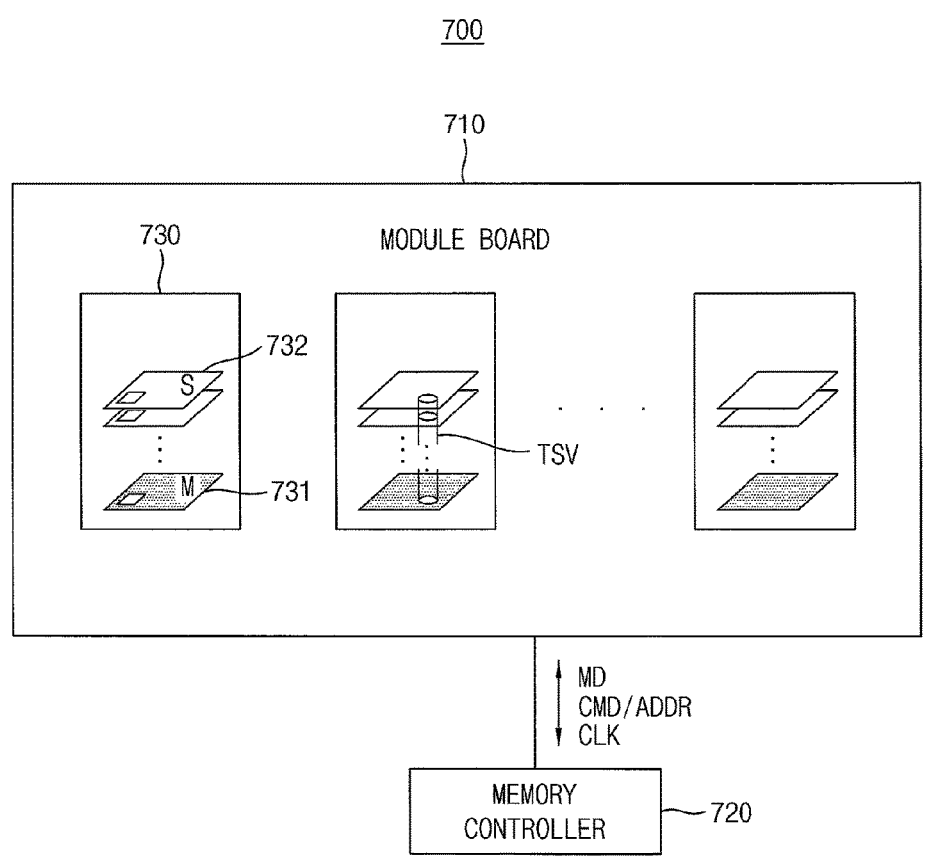
FIG. 23 illustrates a memory system including the semiconductor memory device according to example embodiments.

FIG. 23 illustrates a memory system including the semiconductor memory device according to example embodiments.

Referring to FIG. 23, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip, a MRAM chip, a PRAM chip, or a RRAM chip. In addition, the semiconductor memory device 730 may include a stack of semiconductor chips. For example, the semiconductor chips may include at least one master chip 731 and at least one slave chip 732. Signal transfer between the semiconductor chips may occur via through-substrate vias (e.g., through-silicon vias) TSV.

The master chip 731 and the slave chip 732 may employ the semiconductor memory device 200a of FIG. 3. Therefore, each of the master chip 731 and the slave chip 732 may include a memory cell array and an error correction circuit as described with reference to FIGS. 2 through 21. The error correction circuit may operate as one ECC engine or a plurality of ECC engines in response to an engine configuration selection signal and may implement one or more ECC algorithms. Therefore, performance of the error correction circuit may be enhanced.

In addition, in embodiments of the present disclosure, a three dimensional (3D) memory array is provided in the semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648, which are hereby incorporated by reference in their entirety.

The memory module 710 may communicate with the memory controller 720 via a system bus. Main data MD, a command/address CMD/ADDR, and a clock signal CLK may be transmitted and received between the memory module 710 and the memory controller 720 via the system bus.

Figure 24:
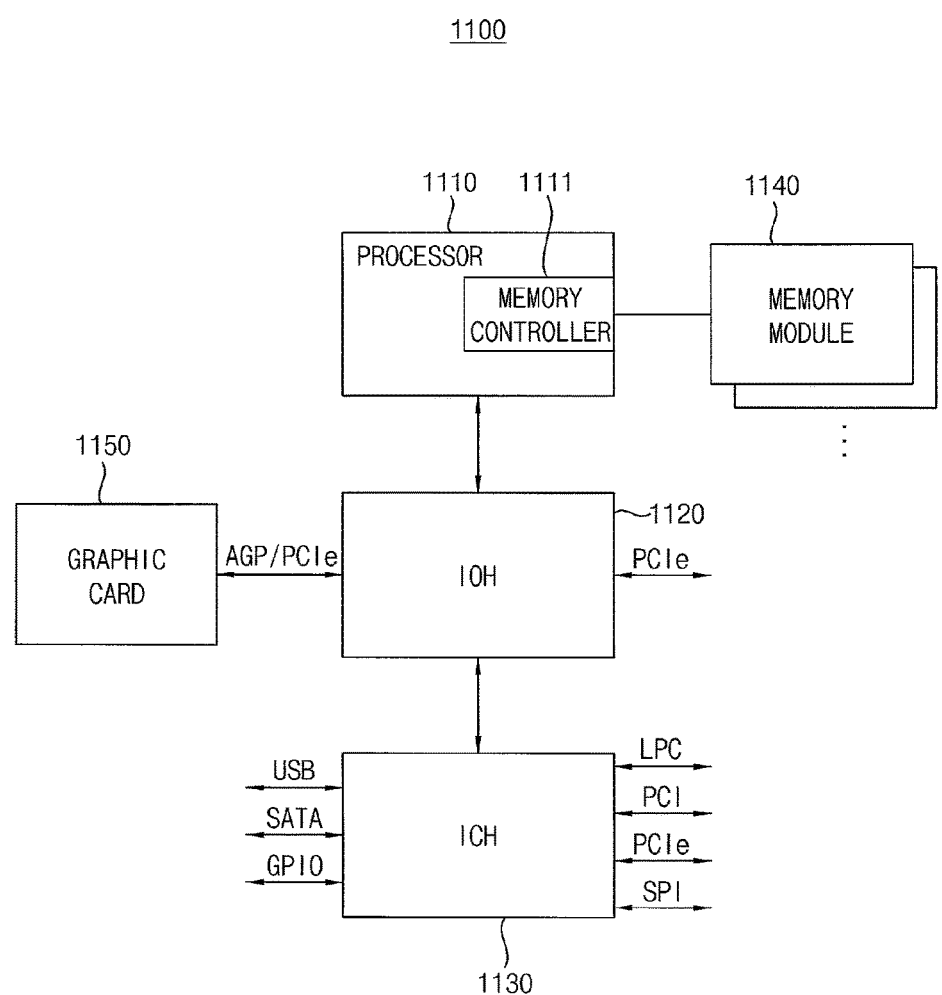
FIG. 24 is a block diagram illustrating a computing system including the semiconductor memory device according to example embodiments.

FIG. 24 is a block diagram illustrating a computing system including the semiconductor memory device according to example embodiments.

Referring to FIG. 24, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 24 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a memory cell array and an error correction circuit as described with reference to FIGS. 2 through 21. The error correction circuit may operate as one ECC engine or a plurality of ECC engines in response to an engine configuration selection signal and may implement one or more ECC algorithms. Therefore, performance of the error correction circuit may be enhanced.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 24 illustrates the computing system 1100 including one input/output hub 1120, in some embodiments, the computing system 1100 may include a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Aspects of the present disclosure may be applied to systems using semiconductor memory devices. For example aspects of the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device, comprising:
a memory cell array including first and second bank arrays, each bank array including first and second sub arrays;
an error correction circuit configured to perform an error correction code (ECC) encoding on write data to be stored in the memory cell array, and configured to perform an ECC decoding on read data from the memory cell array; and
a control logic circuit configured to control access to the memory cell array and configured to generate an engine configuration selection signal and a density mode signal based on a command,
wherein the error correction circuit is configured to reconfigure a number of units for which ECC including the ECC encoding and the ECC decoding is performed, in response to the engine configuration selection signal,
wherein each unit for which ECC is performed corresponds to correcting an error bit among the read data having n bits, wherein n is a natural number greater than 2 and is variable in response to the engine configuration selection signal,
wherein when the density mode signal indicates a first density mode and the engine configuration selection signal indicates a first engine configuration mode, the error correction circuit is configured to operate as one ECC engine configured to perform an ECC encoding on $2^h$-bit write data to generate (h+1)-bit parity data, configured to perform an ECC decoding on $2^h$-bit read data and (h+1)-bit read parity data, and configured to store the $2^h$-bit write data and the (h+1)-bit parity data in the first bank array, wherein h is a natural number equal to or greater than two, and
wherein when the density mode signal indicates a second density mode and the engine configuration selection signal indicates a second engine configuration mode, the error correction circuit is configured to operate as a plurality of ECC engines, each ECC engine configured to perform an ECC encoding on $2^f$-bit write data of $2^h$-bit write data to generate (f+1)-bit parity data, and configured to perform an ECC decoding on $2^f$-bit read data and (f+1)-bit read parity data, and the ECC engines configured to store a group of the $2^f$-bit write data in a first sub array of the first bank array and to store a group of the (f+1)-bit parity data in a first sub array of the second bank array, wherein f is a natural number smaller than h.

2. The semiconductor memory device of claim 1, wherein h is seven.

3. The semiconductor memory device of claim 1, wherein h is seven, f is three and a number of the plurality of ECC engines is sixteen.

4. The semiconductor memory device of claim 1, wherein the error correction circuit comprises:
an ECC engine configured to operate as one ECC engine configured to perform the ECC encoding on the $2^h$-bit write data to generate the (h+1)-bit parity data, and configured to perform the ECC decoding on the $2^h$-bit read data and the (h+1)-bit read parity data from the memory cell array to generate a first syndrome data in the first engine configuration mode, and the ECC engine configured to operate as m ECC engines, each ECC engine configured to perform the ECC encoding on the $2^f$-bit write data to generate the (f+1)-bit parity data, and each ECC engine configured to perform the ECC decoding on the $2^f$-bit read data and the (f+1)-bit read parity data from the memory cell array to generate a second syndrome data in the second engine configuration mode; and
a data corrector configured to correct an error bit among the $2^h$-bit read data based on the first syndrome data in the first engine configuration mode, and configured to correct an error bit among m×$2^f$-bit read data based on the second syndrome data in the second engine configuration mode.

5. The semiconductor memory device of claim 4, wherein the ECC engine comprises:
a check bit generator including m check bit sub generators and configured to generate (h+1)-bit check bits based on the $2^h$-bit read data in the first engine configuration mode, and each check bit sub generator configured to generate (f+1)-bit partial check bits using the $2^f$-bit read data in the second engine configuration mode; and
a syndrome generator configured to generate the first syndrome data based on the (h+1)-bit check bits and the (h+1)-bit read parity data in the first engine configuration mode, and configured to generate the second syndrome data based on m×(f+1)-bit partial check bits and m×(f+1)-bit read parity data in the second engine configuration mode, and wherein the m check bit sub generators are connected to each other and operate in the first engine configuration mode or are separated from each other and operate in the second engine configuration mode.

6. The semiconductor memory device of claim 5, wherein the each check bit sub generators comprises:

a first XOR module configured to perform an XOR operation on $2^f$-bit read data of $2^h$-bit read data to generate first (f+1)-bit partial check bits;

a second XOR module configured to perform an XOR operation on the $2^f$-bit read data to generate second (f+1)-bit partial check bits;

a switch, coupled between the first XOR module and the second XOR module, configured to selectively provide the $2^f$-bit read data to the second XOR module in response to the engine configuration selection signal; and a demultiplexer configured to provide the first (f+1)-bit partial check bits to one of a first path and a second path in response to the engine configuration selection signal.

7. The semiconductor memory device of claim 6, wherein the switch is closed in the first engine configuration mode, and wherein each demultiplexers provides the first (f+1)-bit partial check bits to the first path and the m check bit sub generators are connected to each other to generate (h+1)-bit check bits based on the $2^h$-bit read data.

8. The semiconductor memory device of claim 7, wherein the switch is opened in the second engine configuration mode, and wherein each demultiplexers provides the first (f+1)-bit partial check bits to the second path and each check bit sub generators is configured to generate (f+1)-bit check bits based on the $2^f$-bit read data.

9. The semiconductor memory device of claim 1, wherein a second sub array of the second bank array includes at least one defective memory cell.

10. The semiconductor memory device of claim 1, wherein the memory cell array includes a three-dimensional memory cell array, and wherein the memory cell array includes a plurality of dynamic memory cells or a plurality of resistive type memory cells.

11. The semiconductor memory device of claim 1, wherein the error correction circuit comprises:

a parity generator including m parity sub generators and configured to generate the (h+1)-bit parity data using the $2^h$-bit write data in the first engine configuration mode, and each parity sub generator configured to generate the (f+1)-bit parity data using the $2^f$-bit write data in the second engine configuration mode, wherein m is a natural number greater than 2; and a data corrector configured to generate a first corrected data using the $2^h$-bit read data and the (h+1)-bit read parity data from the memory cell array in the first engine configuration mode, and configured to generate a second corrected data using m×$2^f$-bit read data and m×(f+1)-bit read parity data from the memory cell array in the second engine configuration mode.

12. The semiconductor memory device of claim 11, wherein the $2^h$-bit read data and the (h+1)-bit read parity data in the first engine configuration mode are simultaneously output in response to a first address, and the $2^f$-bit read data and the (f+1)-bit read parity data are simultaneously output in response to the first address.

13. The semiconductor memory device of claim 11, wherein the parity generator includes m parity sub generators, wherein respective m parity sub generators are configured to provide (h+1)-bit parity sub data on a first set of output lines of a corresponding parity sub generator, the respective parity sub generators are connected to each other through the first set of output lines, and the last parity sub generator of the m parity sub generators is configured to provide the (h+1)-bit parity data to the memory cell array in the first engine configuration mode, wherein each of the m parity sub generators is configured to generate (f+1)-bit parity data on second set of output lines of the corresponding parity sub generator in the second engine configuration mode, and wherein m is a natural number equal to or greater than 2.

14. The semiconductor memory device of claim 13, further comprising:

a check bit generator including m check bit sub generators and configured to generate (h+1)-bit check bits using the $2^h$-bit read data in the first engine configuration mode, and each check bit sub generator configured to generate (f+1)-bit check bits using the $2^f$-bit read data in the second engine configuration mode, wherein respective m check bit sub generators are configured to provide (h+1)-bit check bit sub data on a first set of output lines of a corresponding check bit sub generator, the respective m check bit sub generators are connected to each other through the first set of output lines of the respective m check bit sub generators, the last check bit sub generator of the m check bit sub generators is configured to generate the (h+1)-bit check bits in the first engine configuration mode, and wherein each check bit sub generator is configured to provide (f+1)-bit check bits on second set of output lines of the corresponding check bit sub generator in the second engine configuration mode.

* * * * *